United States Patent
More et al.

(10) Patent No.: US 12,119,394 B2
(45) Date of Patent: *Oct. 15, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Shahaji B. More, Hsinchu (TW); Chien Lin, Hsinchu (TW); Cheng-Han Lee, New Taipei (TW); Shih-Chieh Chang, Taipei (TW); Shu Kuan, Keelung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/843,601

(22) Filed: Jun. 17, 2022

(65) Prior Publication Data

US 2022/0320321 A1    Oct. 6, 2022

Related U.S. Application Data

(62) Division of application No. 16/902,170, filed on Jun. 15, 2020, now Pat. No. 11,367,784.

(51) Int. Cl.
*H01L 29/66*   (2006.01)
*H01L 21/306*  (2006.01)
(Continued)

(52) U.S. Cl.
CPC .. *H01L 29/66818* (2013.01); *H01L 21/30604* (2013.01); *H01L 21/823431* (2013.01);
(Continued)

(58) Field of Classification Search
CPC ......... H01L 29/66818; H01L 21/30604; H01L 21/823431; H01L 29/1054; H01L 29/161;
(Continued)

(56) References Cited

U.S. PATENT DOCUMENTS 9,236,267 B2   1/2016 De et al.
9,502,265 B1  11/2016 Jiang et al.
(Continued)

FOREIGN PATENT DOCUMENTS

TW    201914950 A   4/2019
TW      I657490 B   4/2019
TW    201917780 A   5/2019

OTHER PUBLICATIONS

Non-Final Office Action issued in related U.S. Appl. No. 16/902,170, dated Oct. 14, 2021.
(Continued)

*Primary Examiner* — Cuong B Nguyen
(74) *Attorney, Agent, or Firm* — STUDEBAKER & BRACKETT PC

(57) ABSTRACT

In a method of manufacturing a semiconductor device, a fin structure, in which first semiconductor layers and second semiconductor layers are alternately stacked, is formed. A sacrificial gate structure is formed over the fin structure. A source/drain region of the fin structure, which is not covered by the sacrificial gate structure, is etched, thereby forming a source/drain space. The first semiconductor layers are laterally etched through the source/drain space. An inner spacer made of a dielectric material is formed on an end of each of the etched first semiconductor layers. A source/drain epitaxial layer is formed in the source/drain space to cover the inner spacer. At least one of the first semiconductor layers (Continued)

has a composition which changes along a stacked direction of the first semiconductor layers and second semiconductor layers.

20 Claims, 26 Drawing Sheets

(51) Int. Cl.
*H01L 21/8234* (2006.01)
*H01L 29/10* (2006.01)
*H01L 29/161* (2006.01)
*H01L 29/423* (2006.01)
*H01L 29/78* (2006.01)

(52) U.S. Cl.
CPC ........ *H01L 29/1054* (2013.01); *H01L 29/161* (2013.01); *H01L 29/42392* (2013.01); *H01L 29/66553* (2013.01); *H01L 29/6656* (2013.01); *H01L 29/785* (2013.01)

(58) Field of Classification Search
CPC ......... H01L 29/42392; H01L 29/66553; H01L 29/6656; H01L 29/785; H01L 29/0673; H01L 29/36; H01L 29/66439; H01L 29/513; H01L 29/775; H01L 29/78696; H01L 29/165; H01L 29/7848; H01L 29/66545; H01L 21/823821; H01L 21/823878; H01L 27/0924; B82Y 10/00

See application file for complete search history.

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 11,367,784 B2 * | 6/2022 | More ................ H01L 29/66818 |
| 2018/0301531 A1 | 10/2018 | Xie |
| 2019/0221483 A1 | 7/2019 | Mulfinger et al. |
| 2019/0341469 A1 | 11/2019 | Cheng et al. |
| 2021/0273047 A1 | 9/2021 | Kuan |
| 2021/0273099 A1 | 9/2021 | More |

OTHER PUBLICATIONS

Notice of Allowance issued in related U.S. Appl. No. 16/902,170, dated Feb. 8, 2022.

* cited by examiner

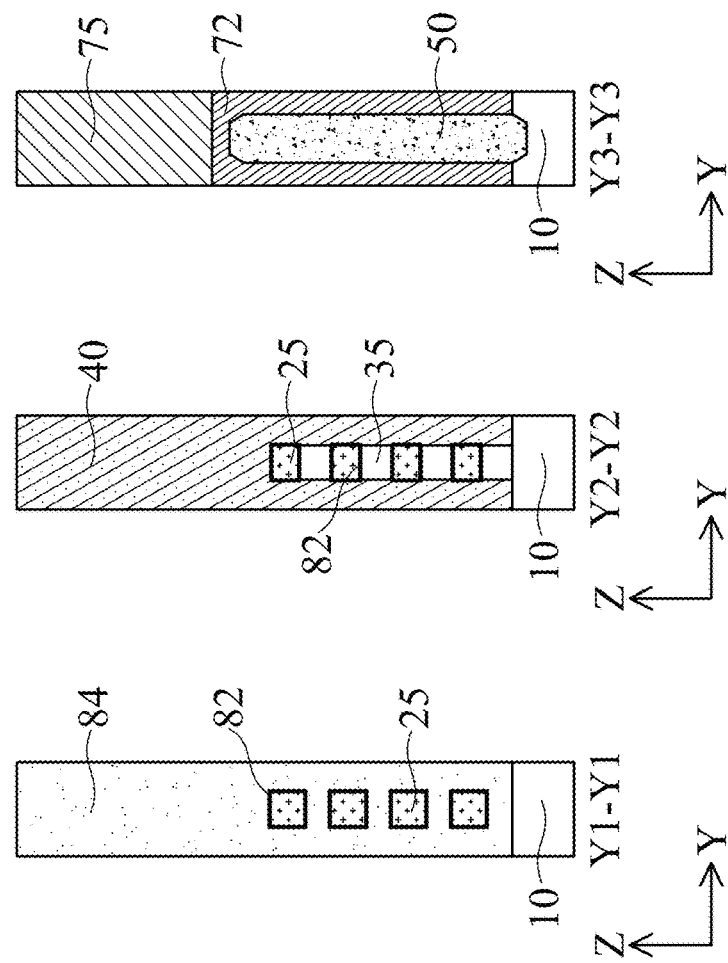
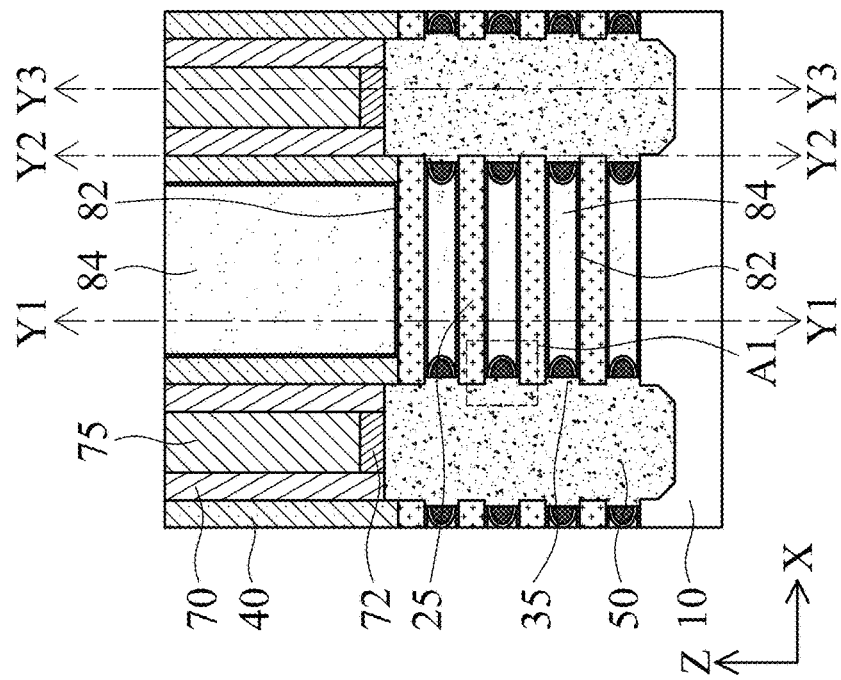

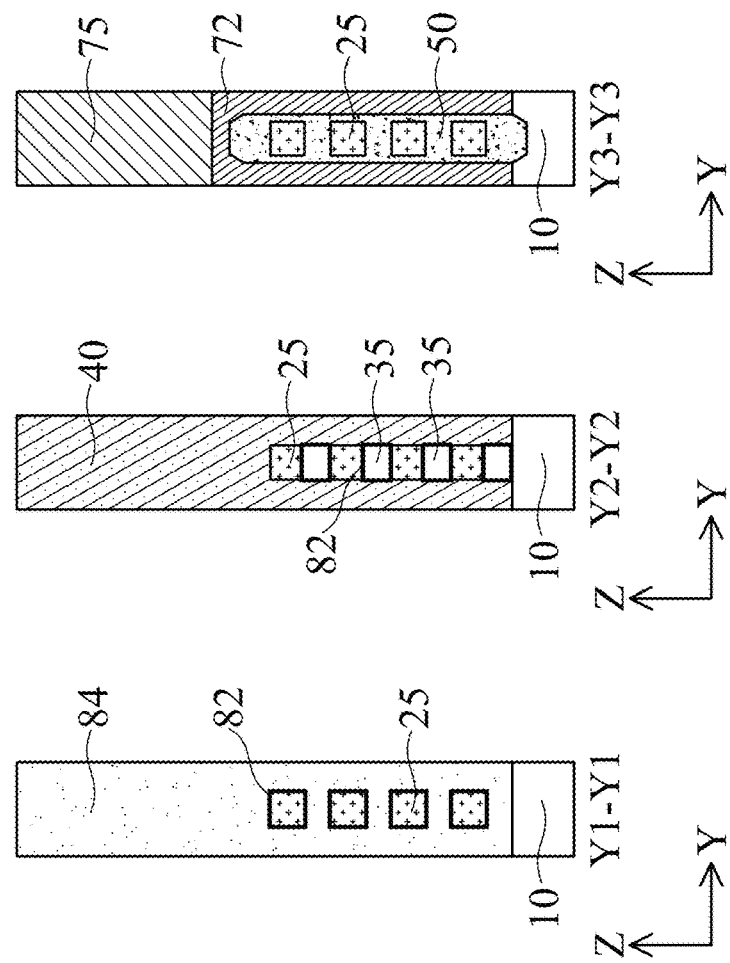
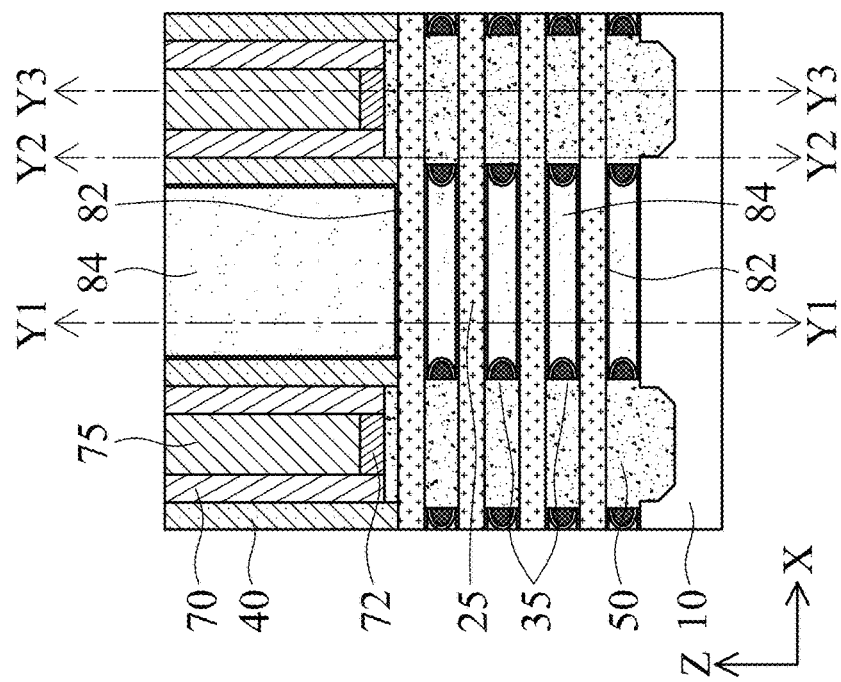
FIG. 2D
FIG. 2C
FIG. 2B
FIG. 2A

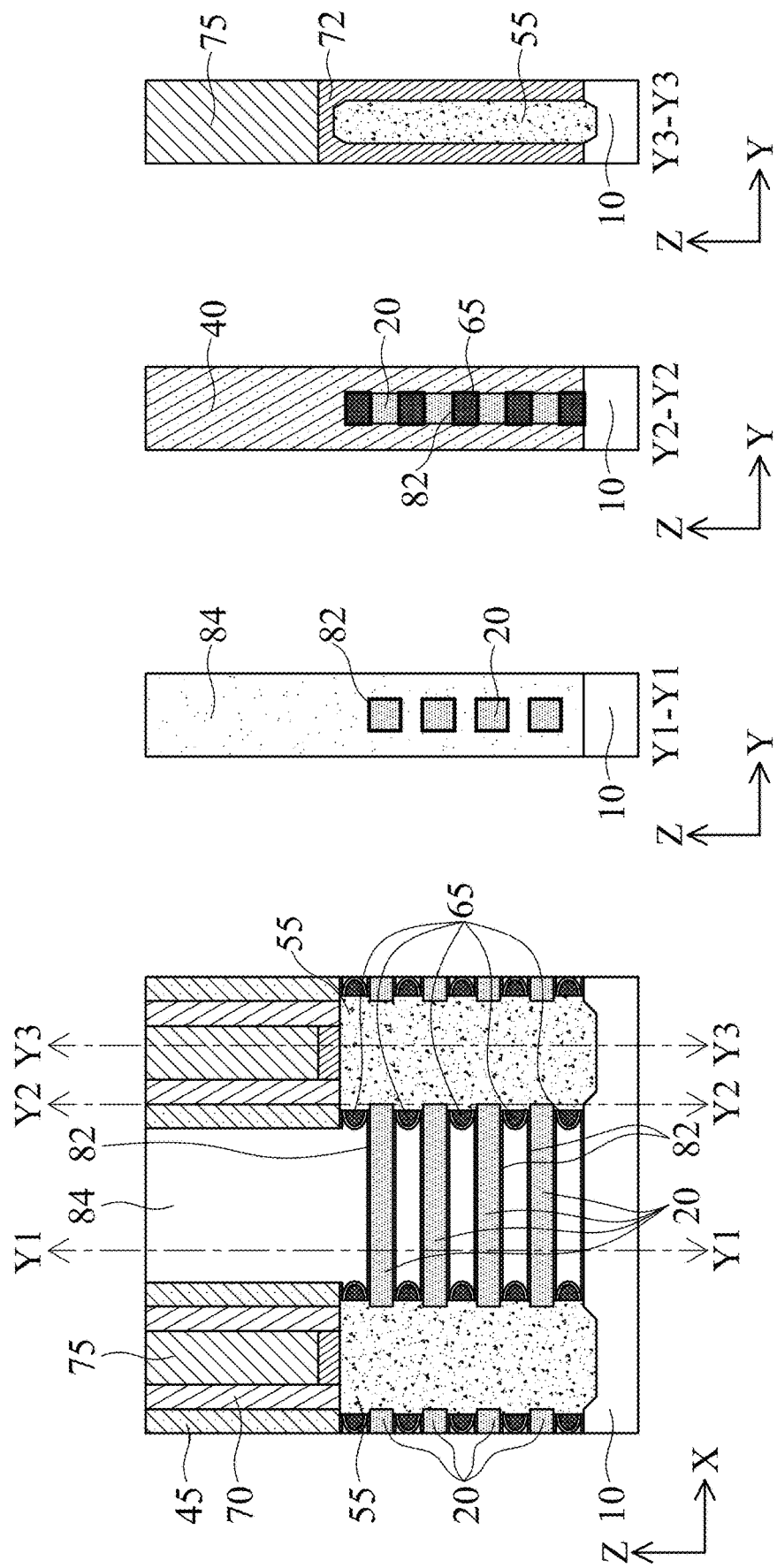

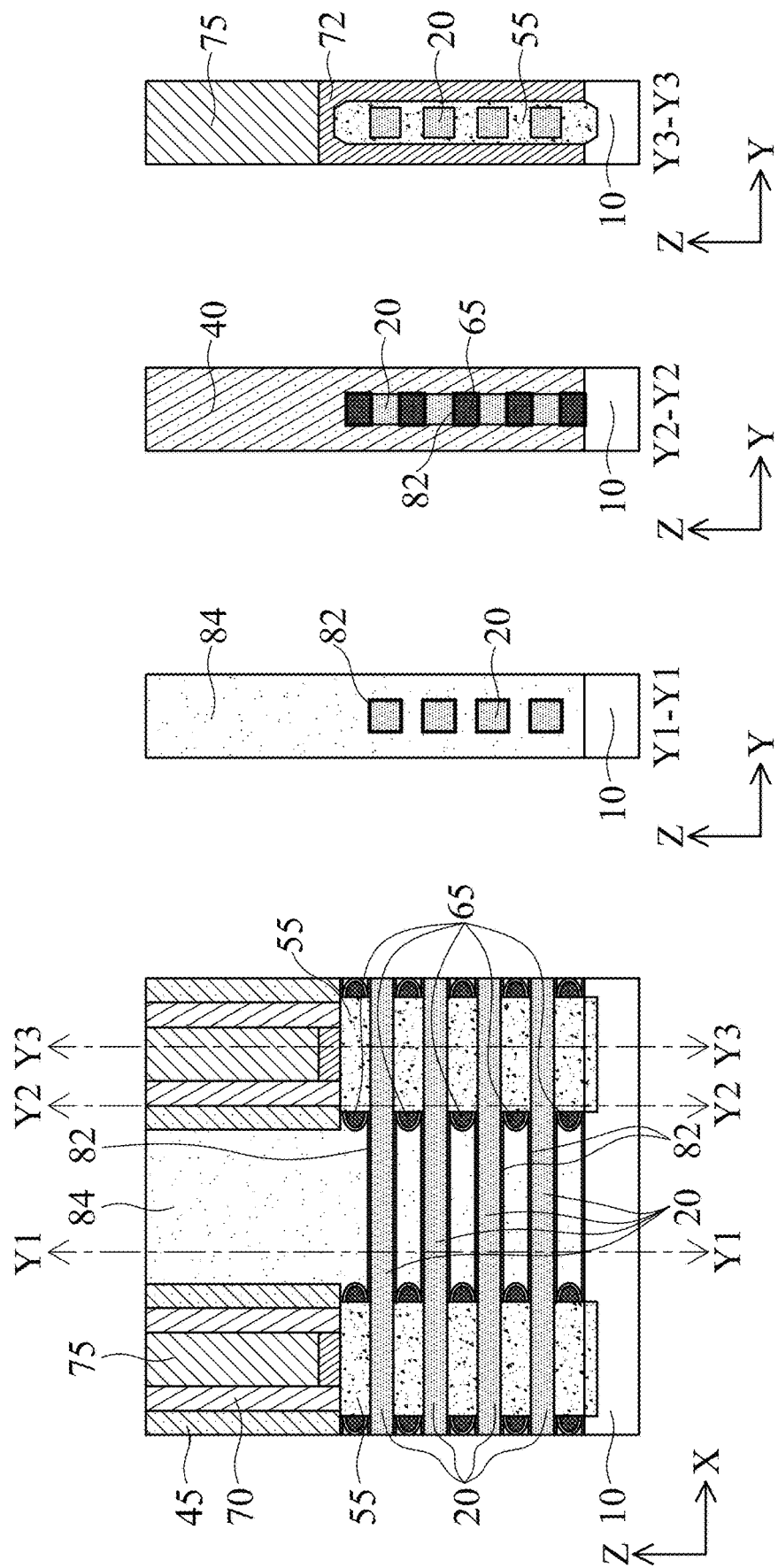

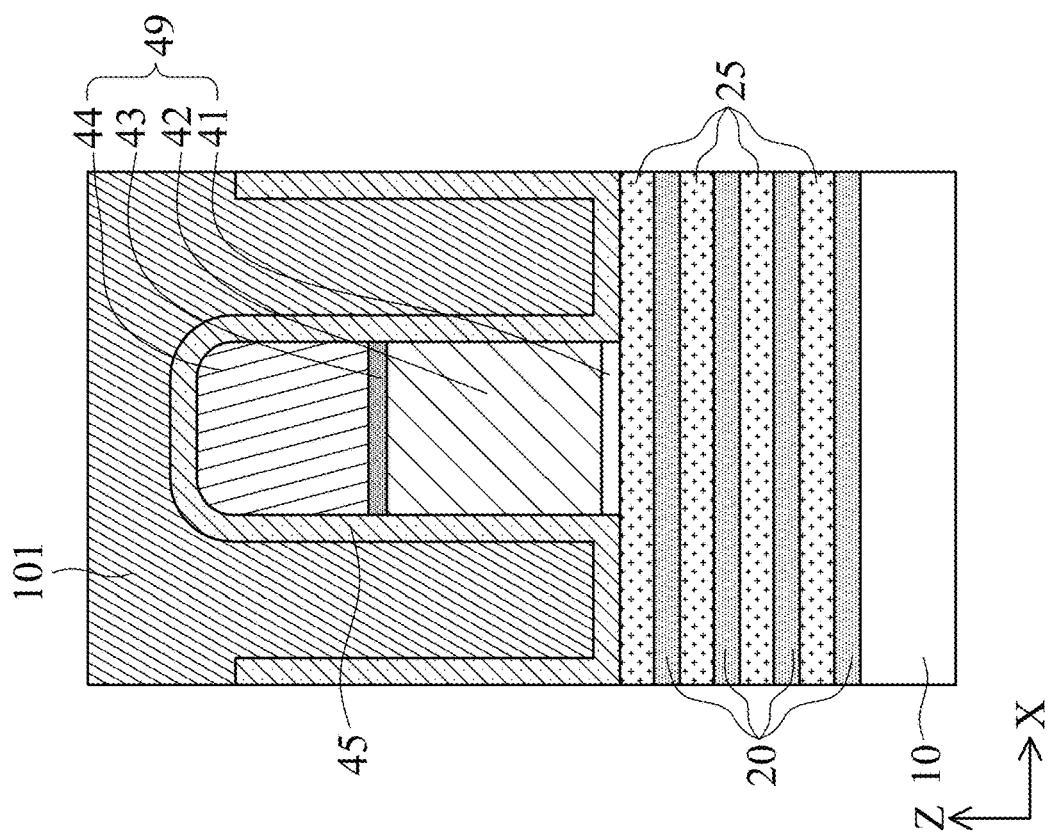
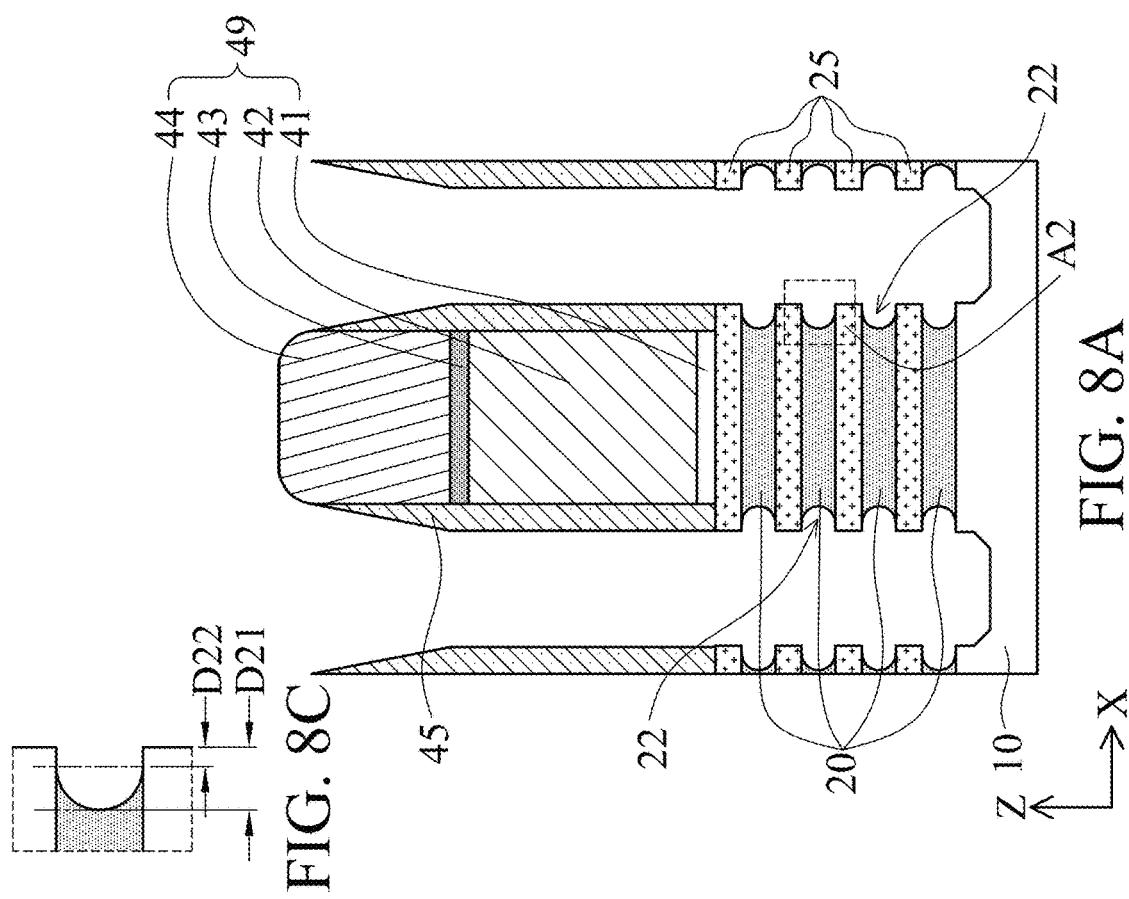
FIG. 8A  FIG. 8B  FIG. 8C

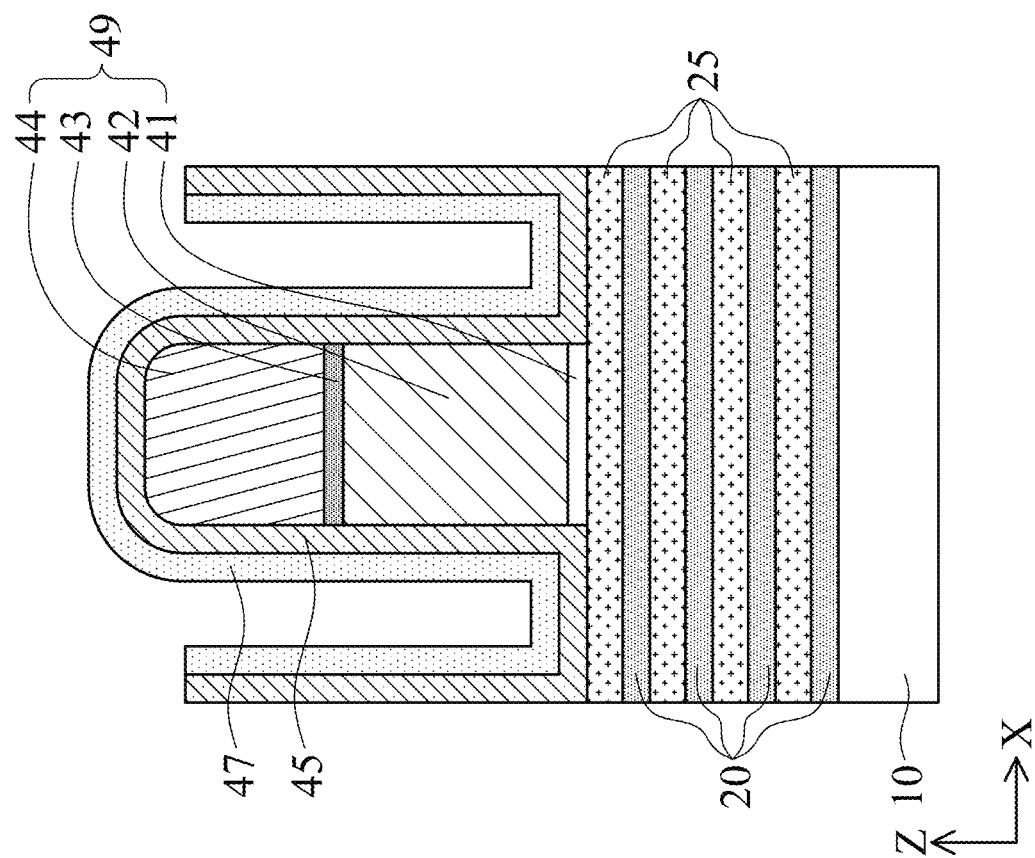
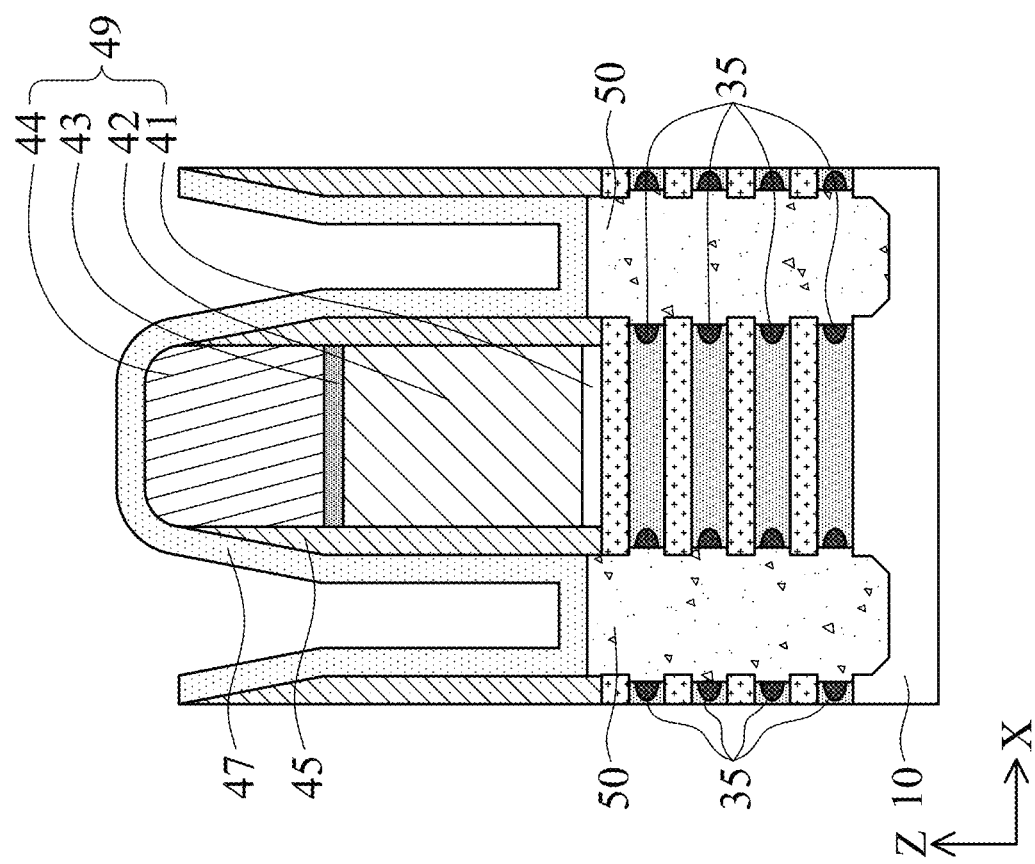

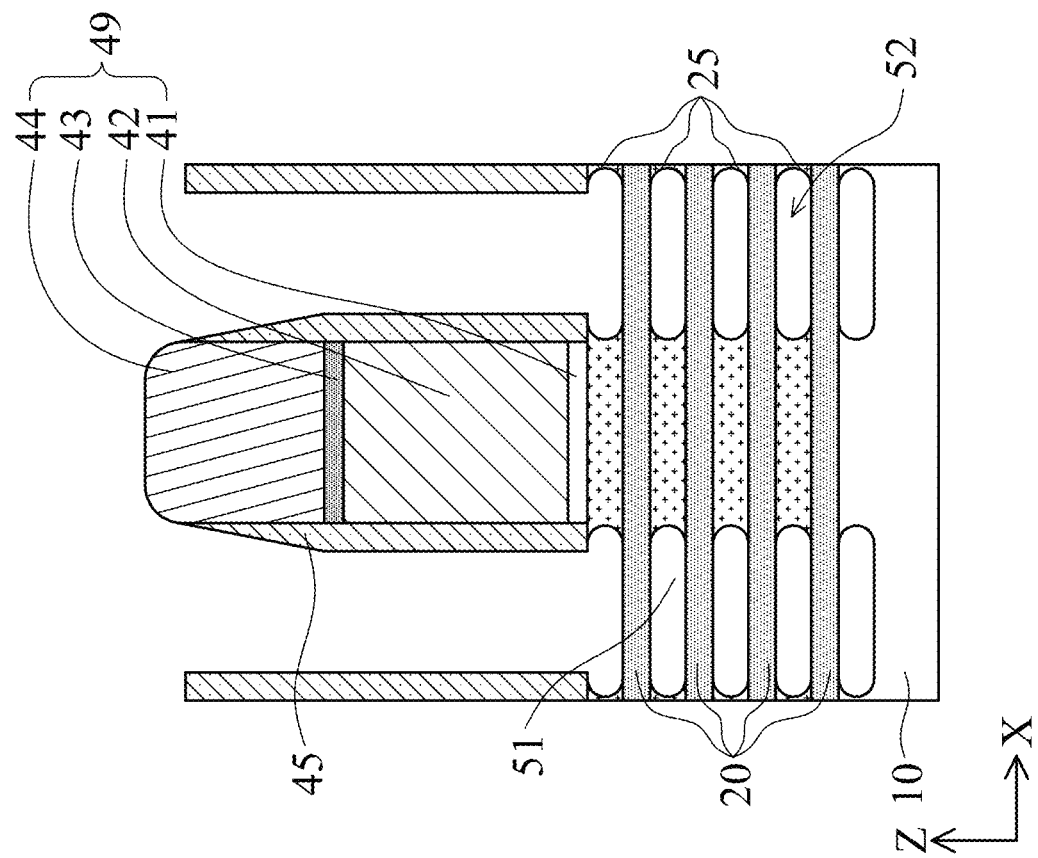
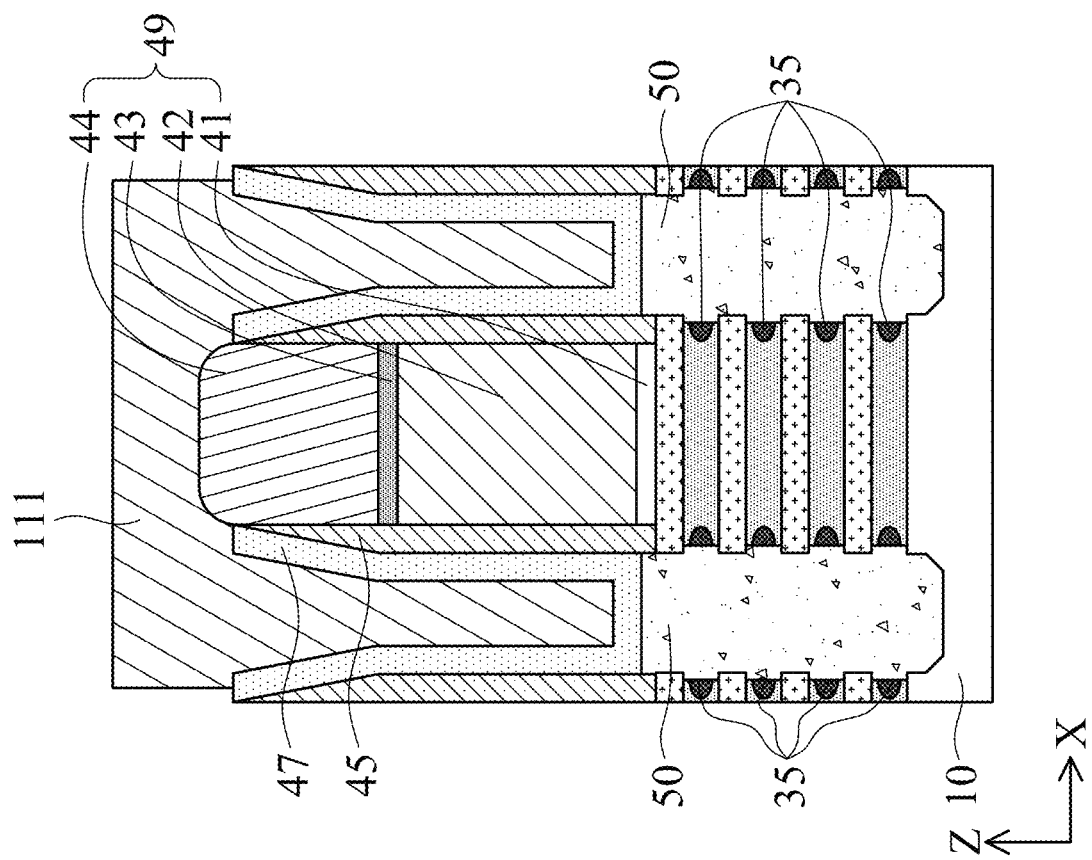
FIG. 15A
FIG. 15B

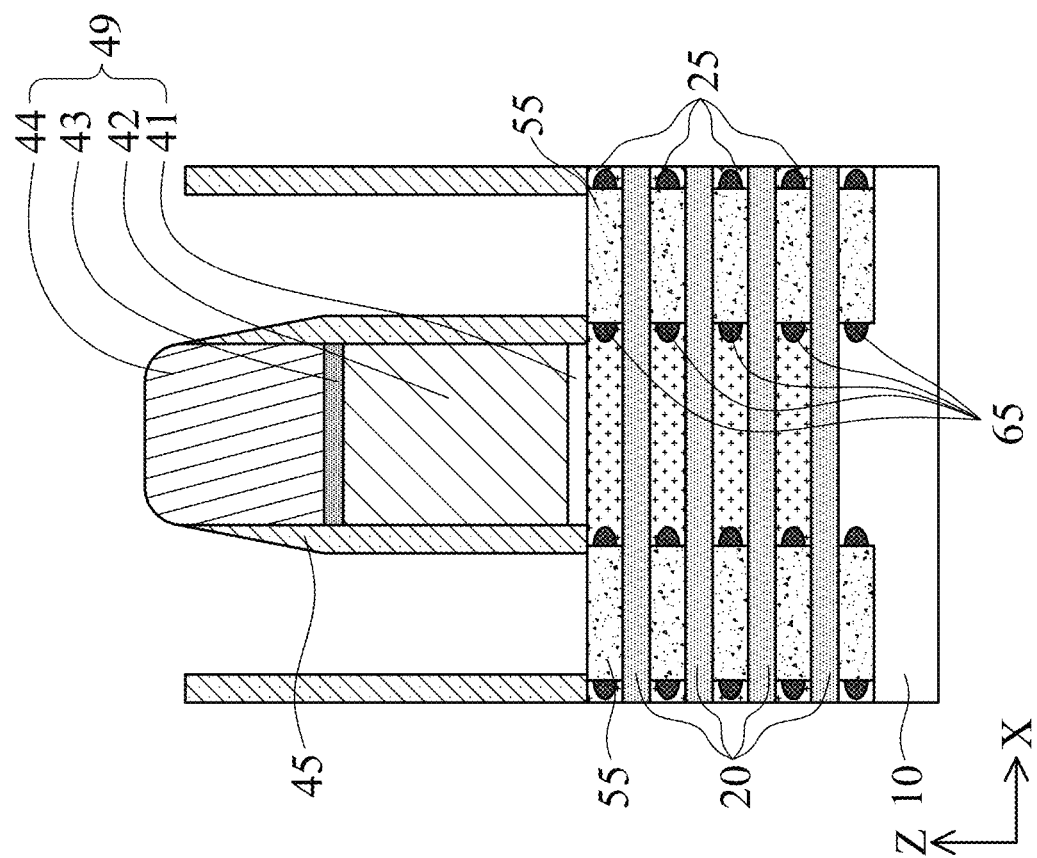
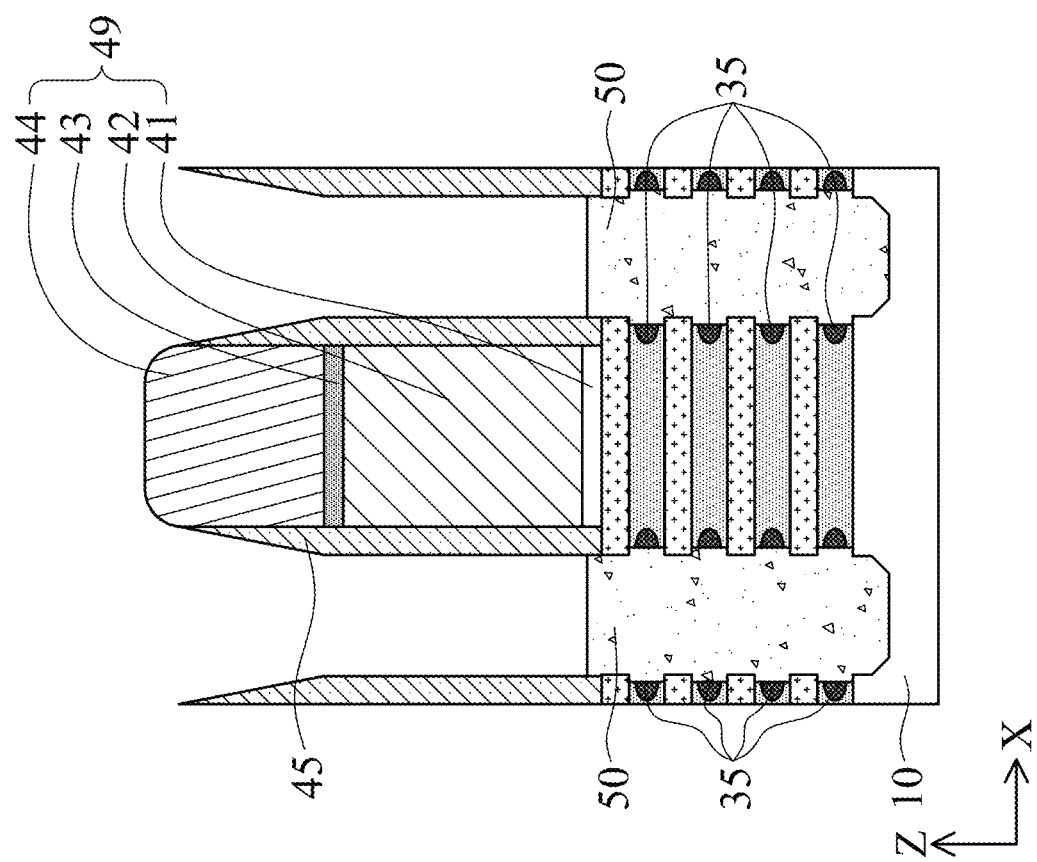
FIG. 18A
FIG. 18B

METHOD OF MANUFACTURING A SEMICONDUCTOR DEVICE AND A SEMICONDUCTOR DEVICE

RELATED APPLICATION

This application is divisional of U.S. patent application Ser. No. 16/902,170 filed Jun. 15, 2020, now U.S. Pat. No. 11,367,784, the entire contents of which are incorporated herein by reference.

TECHNICAL FIELD

The disclosure relates to methods of manufacturing semiconductor integrated circuits, and more particularly to methods of manufacturing semiconductor devices including fin field effect transistors (FinFETs) and/or gate-all-around (GAA) FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1E show various views of a semiconductor FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. FIG. 1E shows an enlarged view of area A1 shown in FIG. 1A.

FIGS. 2A-2D show various views of a semiconductor FET device according to an embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A.

FIGS. 3A-3D show various views of a semiconductor FET device according to an embodiment of the present disclosure. FIG. 3A is a cross sectional view along the X direction (source-drain direction), FIG. 3B is a cross sectional view corresponding to Y1-Y1 of FIG. 3A, FIG. 3C is a cross sectional view corresponding to Y2-Y2 of FIG. 3A and FIG. 3D shows a cross sectional view corresponding to Y3-Y3 of FIG. 3A.

FIGS. 4A-4D show various views of a semiconductor FET device according to an embodiment of the present disclosure. FIG. 4A is a cross sectional view along the X direction (source-drain direction), FIG. 4B is a cross sectional view corresponding to Y1-Y1 of FIG. 4A, FIG. 4C is a cross sectional view corresponding to Y2-Y2 of FIG. 1A and FIG. 4D shows a cross sectional view corresponding to Y3-Y3 of FIG. 4A.

FIGS. 5B, 5C, 5D and 5E show composition changes (profile) of first semiconductor layers.

FIG. 7A shows a cross sectional view for an n-type GAA FET, and FIG. 7B shows a cross sectional view for a p-type GAA FET.

FIGS. 8A, 8B and 8C show one of the various stages of manufacturing a semiconductor GAA FET device according to an embodiment of the present disclosure. FIG. 8A shows a cross sectional view for an n-type GAA FET, and FIG. 8B shows a cross sectional view for a p-type GAA FET. FIG. 8C is an enlarged view of area A2 of FIG. 8A.

FIG. 9A shows a cross sectional view for an n-type GAA FET, and FIG. 9B shows a cross sectional view for a p-type GAA FET.

FIG. 10A shows a cross sectional view for an n-type GAA FET, and FIG. 10B shows a cross sectional view for a p-type GAA FET.

FIG. 11A shows a cross sectional view for an n-type GAA FET, and FIG. 11B shows a cross sectional view for a p-type GAA FET.

FIGS. 12A and 12B show one of the various stages of manufacturing a semiconductor GAA FET device according to an embodiment of the present disclosure. FIG. 12A shows a cross sectional view for an n-type GAA FET, and FIG. 12B shows a cross sectional view for a p-type GAA FET.

FIG. 13A shows a cross sectional view for an n-type GAA FET, and FIG. 13B shows a cross sectional view for a p-type GAA FET.

FIG. 14A shows a cross sectional view for an n-type GAA FET, and FIG. 14B shows a cross sectional view for a p-type GAA FET.

FIGS. 15A and 15B show one of the various stages of manufacturing a semiconductor GAA FET device according to an embodiment of the present disclosure. FIG. 15A shows a cross sectional view for an n-type GAA FET, and FIG. 15B shows a cross sectional view for a p-type GAA FET.

FIG. 16A shows a cross sectional view for an n-type GAA FET, and FIG. 16B shows a cross sectional view for a p-type GAA FET.

FIG. 17A shows a cross sectional view for an n-type GAA FET, and FIG. 17B shows a cross sectional view for a p-type GAA FET.

FIGS. 18A and 18B show one of the various stages of manufacturing a semiconductor GAA FET device according to an embodiment of the present disclosure. FIG. 18A shows a cross sectional view for an n-type GAA FET, and FIG. 18B shows a cross sectional view for a p-type GAA FET.

FIG. 19A shows a cross sectional view for an n-type GAA FET, and FIG. 19B shows a cross sectional view for a p-type GAA FET.

FIG. 20A shows a cross sectional view for an n-type GAA FET, and FIG. 20B shows a cross sectional view for a p-type GAA FET.

DETAILED DESCRIPTION

Figure 1E:
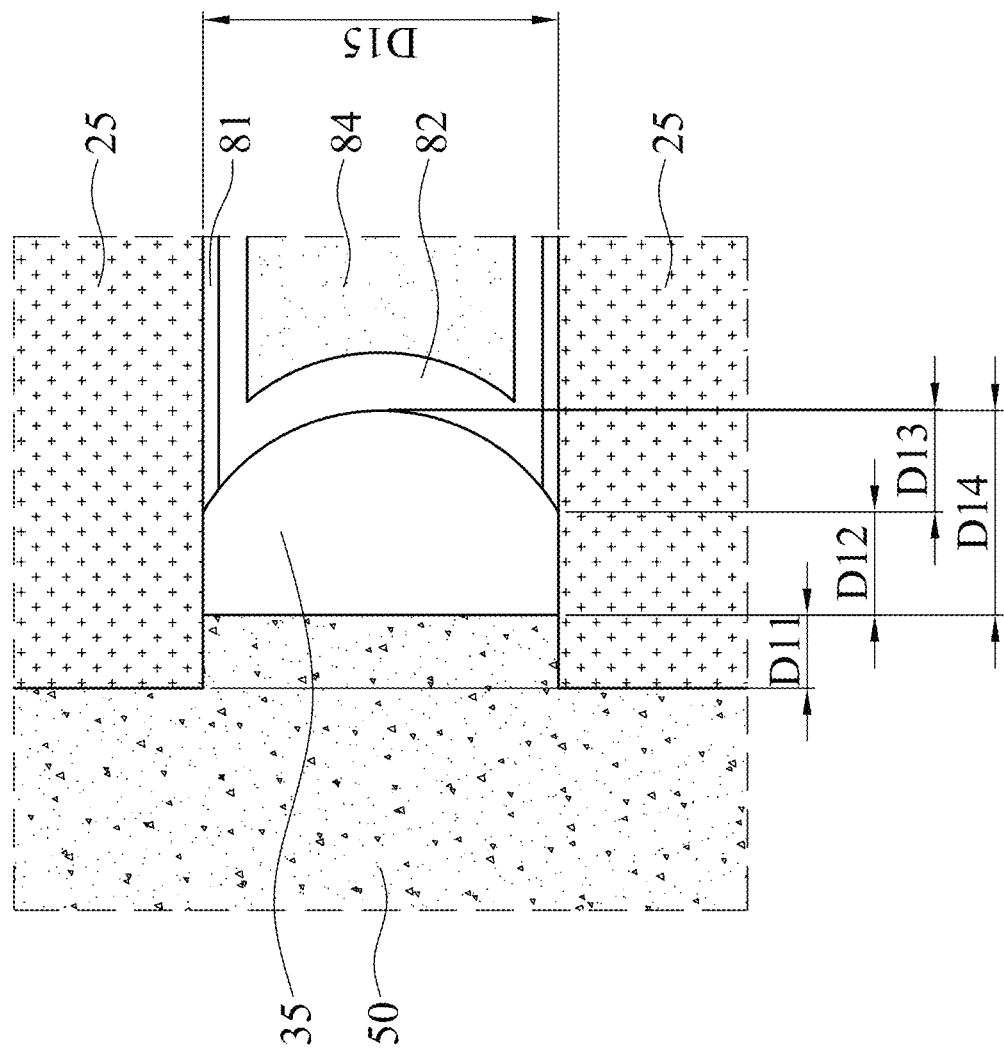

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, it is difficult to control lateral etching amounts when the nanowires (NWs) are released by selectively etching sacrificial semiconductor layers. The lateral ends of the NWs may be etched when the NW release etching process is performed after a dummy polysilicon gate is removed, because a lateral etching control or an etching budget for NW release etch is not sufficient. A gate electrode may touch a source/drain (source/drain) epitaxial layer if there is no etch stop layer. Further, there is a lager impact on gate to drain capacitance (Cgd). If no dielectric film existed between the gate and the source/drain region, Cgd becomes larger, which would reduce circuit speed.

Further, in a GAA FET, an inner spacer is provided between a metal gate electrode and a source/drain (source/drain) epitaxial layer. However, it is difficult to control the shape of the inner spacers due to narrow spaces between adjacent semiconductor layers not to be etched. The inner spacers act as an extra source of channel resistance, thereby hindering the gate control capability. A higher channel height in a GAA FET causes more difficulties in controlling a uniformity of the structure from the channel bottom to the channel top in deposition and etching processes. In particular, achieving a higher process uniformity within a 12-inch wafer becomes more difficult in a GAA FET fabrication method.

In the present disclosure, a novel method for fabricating an inner spacer between a metal gate electrode and a source/drain (source/drain) epitaxial layer for a GAA FET and a stacked channel FET are provided. In particular, in the present disclosure, the sacrificial semiconductor layers have a modulated composition (e.g., Ge concentration) and the lateral etching of the sacrificial semiconductor layer is controlled by the modulated composition. By employing the modulated composition, it is possible to control the shape of the inner spacers, thereby improving the gate control capability.

In this disclosure, a source/drain refers to a source and/or a drain. It is noted that in the present disclosure, a source and a drain are interchangeably used and the structures thereof are substantially the same.

FIGS. 1A-1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. FIG. 1E shows an enlarged view of area A1 shown in FIG. 1A. In some embodiments, the semiconductor GAA FET device of FIGS. 1A-1D is an n-type FET.

As shown in FIGS. 1A-1C, semiconductor wires or sheets 25 are provided over a semiconductor substrate 10, and vertically arranged along the Z direction (the normal direction of the principal surface of the substrate 10). In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires or sheets 25, which are channel layers, are disposed over the substrate 10. In some embodiments, the semiconductor wires 25 are disposed over a fin structure 11 (see, FIG. 5F) protruding from the substrate 10. Each of the channel layers 25 is wrapped around by a gate dielectric layer 82 and a gate electrode layer 84. The thickness of the semiconductor wires 25 is in a range from about 5 nm to about 60 nm and the width of the semiconductor wires 25 is in a range from about 5 nm to about 20 nm in some embodiments. In some embodiments, the width of the semiconductor wires or sheets is greater than the thickness. In certain embodiments, the width is up to twice or five times the thickness of the semiconductor wires or sheets 25.

In some embodiments, an interfacial dielectric layer 81 is formed between the channel of the semiconductor wire 25 and the gate dielectric layer 82, as shown in FIG. 1E. In some embodiments, the gate dielectric layer 82 includes a high-k dielectric layer. The gate structure includes the gate dielectric layer 82, the gate electrode layer 84 and sidewall spacers 40. Although FIGS. 1A-1C show four semiconductor wires 25, the number of the semiconductor wires 25 is not limited to four, and may be as small as one or more than four, and may be up to ten. By adjusting the numbers of the semiconductor wires, a driving current of the GAA FET device can be adjusted.

Further, a source/drain epitaxial layer 50 is disposed over the substrate 10. The source/drain epitaxial layer 50 is in direct contact with end faces of the channel layer 25, and is separated by insulating inner spacers 35 and the gate dielectric layer 82 from the gate electrode layer 84. In some embodiments, an additional insulating layer (not shown) is conformally formed on the inner surface of the spacer regions.

An interlayer dielectric (ILD) layer 70 is disposed over the source/drain epitaxial layer 50 and a conductive contact layer 72 is disposed on the source/drain epitaxial layer 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium.

As shown FIGS. 1A and 1E, the cross section along the X direction of the inner spacer 35 has a rounded shape (e.g., semi-circular or U-shape) convex toward the gate electrode. In some embodiments, a distance D11 between the end of the second semiconductor wires or sheets 25 and the interface between the epitaxial layer 50 and the inner spacer 35 is in a range from about 0.2 nm to about 3 nm and in in a range from about 0.5 nm to about 2 nm in other embodiments, depending on the design and/or process requirements. In some embodiments, a distance D12, at which the inner spacer 25 is fully in contact with the second semiconductor layer 25 is in a range from about 0.5 nm to about 5 nm and in in a range from about 1 nm to about 3 nm in other embodiments, depending on the design and/or process requirements. In some embodiments, a distance D13, which is a thickness of the inner spacer 35 not contacting the second semiconductor layer 25, is in a range from about 0.2 nm to about 3 nm and in in a range from about 0.5 nm to about 2 nm in other embodiments, depending on the design and/or process requirements. In some embodiments, D12 is greater than D13 and D12/D13 is greater than 1 and equal to or less than about 3. In other embodiments, D12/D13 is in a range from about 0.8 to about 1.0. A distance D14 is the lateral thickness of the inner spacer 35 (D14=D12+D13) and is in a range from about 0.7 nm to about 8 nm in some embodiments and in in a range from about 1.5 nm to about 5 nm in other embodiments, depending on the design and/or process requirements. A distance D15 is a vertical thickness of the inner spacer 35, and is in a range from about 5 nm to about 60 nm in some embodiments, and is in a range from about 10 nm to about 30 nm in other embodiments.

FIGS. 2A-2D show various views of a semiconductor FET device according to another embodiment of the present disclosure. FIG. 2A is a cross sectional view along the X direction (source-drain direction), FIG. 2B is a cross sectional view corresponding to Y1-Y1 of FIG. 2A, FIG. 2C is a cross sectional view corresponding to Y2-Y2 of FIG. 2A and FIG. 2D shows a cross sectional view corresponding to Y3-Y3 of FIG. 2A. Material, configuration, dimensions and/or processes the same as or similar to the foregoing embodiments described with respect to FIGS. 1A-1D may be employed in the embodiment of FIGS. 2A-2D, and detailed explanation thereof may be omitted. In some embodiments, the semiconductor GAA FET device of FIGS. 2A-2D is an n-type FET.

In this embodiment, the source/drain epitaxial layer 50 wraps around end portions of the semiconductor wires 25 disposed at the source/drain regions, or the semiconductor wires 25 pass through the source/drain epitaxial layer 50.

In the embodiments of FIGS. 1A-1F and 2A-2D, the GAA FET is an n-type GAA FET. The semiconductor wires 25 are made of Si or $Si_{1-x}Ge_x$, where x is equal to or less than 0.2. The source/drain epitaxial layer 50 is made of one or more of Si, SiP, SiC or SiCP.

FIGS. 3A-3D show various views of a semiconductor FET device according to another embodiment of the present disclosure. FIG. 3A is a cross sectional view along the X direction (source-drain direction), FIG. 3B is a cross sectional view corresponding to Y1-Y1 of FIG. 3A, FIG. 3C is a cross sectional view corresponding to Y2-Y2 of FIG. 3A and FIG. 3D shows a cross sectional view corresponding to Y3-Y3 of FIG. 3A. Material, configuration, dimensions and/or processes the same as or similar to the foregoing embodiments described with respect to FIGS. 1A-2D may be employed in the embodiment of FIGS. 3A-3D, and detailed explanation thereof may be omitted. In the embodiments of FIGS. 3A-3D, the GAA FET is a p-type GAA FET.

The semiconductor wires 20, which are channel layers and are made of $Si_{1-x}Ge_x$, where x is equal to or more than about 0.1 and equal to or less than about 0.6 (hereinafter may be merely referred to as SiGe), are disposed over the substrate 10. As explained below, the composition of the semiconductor wires or sheets 20 vertically changes. As explained below, one or more semiconductor wires 20 has a modulated Ge concentration.

In some embodiments, the semiconductor wires 20 are disposed over a fin structure 11 (see, FIG. 5F) protruding from the substrate 10. The thickness of the semiconductor wires 20 is in a range from about 5 nm to about 60 nm and the width of the semiconductor wires 20 is in a range from about 5 nm to about 15 nm in some embodiments. In some embodiments, the width of the second semiconductor wires or sheets is greater than the thickness. In certain embodiments, the width is up to twice or five times the thickness of the second semiconductor wires or sheets 25.

Each of the channel layers 20 is wrapped around by a gate dielectric layer 82 and a gate electrode layer 84. In some embodiments, the gate dielectric layer 82 includes an interfacial layer and a high-k dielectric layer. The gate structure includes the gate dielectric layer 82, the gate electrode layer 84 and sidewall spacers 40. Although FIGS. 3A-3C shows four semiconductor wires 20, the number of the semiconductor wires 20 is not limited to four, and may be as small as one or more than four and may be up to ten.

Further, a source/drain epitaxial layer 55 is disposed over the substrate 10. The source/drain epitaxial layer 55 is in direct contact with and faces the channel layers 20, and is separated by insulating inner spacers 65 and the gate dielectric layer 82 from the gate electrode layer 84. The source/drain epitaxial layer 55 is made of one or more of Si, SiGe and SiGeB. In some embodiments, an additional insulating layer (not shown) is conformally formed on the inner surface of the spacer regions.

As shown FIG. 3A, the cross section along the X direction of the inner spacer 65 has a rounded shape (e.g., semicircular or U-shape) convex toward the gate electrode. In some embodiments, the inner spacers 65 are disposed above the uppermost semiconductor wire 25.

FIGS. 4A-4D show various views of a p-type GAA FET device according to another embodiment of the present disclosure. FIG. 4A is a cross sectional view along the X direction (source-drain direction), FIG. 4B is a cross sectional view corresponding to Y1-Y1 of FIG. 4A, FIG. 4C is a cross sectional view corresponding to Y2-Y2 of FIG. 4A and FIG. 4D shows a cross sectional view corresponding to Y3-Y3 of FIG. 4A. Material, configuration, dimensions and/or processes the same as or similar to the foregoing embodiments described with respect to FIGS. 1A-3D may be employed in the embodiment of FIGS. 4A-4D, and detailed explanation thereof may be omitted.

In this embodiment, the source/drain epitaxial layer 55 wraps around end portions of the semiconductor wires 20 disposed at the source/drain regions, or the semiconductor wires 20 pass through the source/drain epitaxial layer 55. As explained below, one or more semiconductor wires 20 has a modulated Ge concentration.

In some embodiments, two or more of the GAA FETs shown in FIGS. 1A-4D are disposed on one semiconductor substrate (chip) to achieve various circuit functions.

FIGS. 5A to 20B show various stages of manufacturing a semiconductor FET device according to an embodiment of the present disclosure. In FIGS. 7A-20B, the "A" figures are cross sectional views along the X direction (source-drain direction) for an n-type GAA FET, and the "B" figures are cross sectional views along the X direction for a p-type GAA FET. It is understood that in FIGS. 7A-20B, the n-type GAA FET and the p-type GAA FET are formed on the same substrate (a chip) in some embodiments. It is understood that additional operations can be provided before, during, and after processes shown by FIGS. 5A-20B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-4D may be employed in the embodiment of FIGS. 5A-20B, and detailed explanation thereof may be omitted.

Figure 5A:
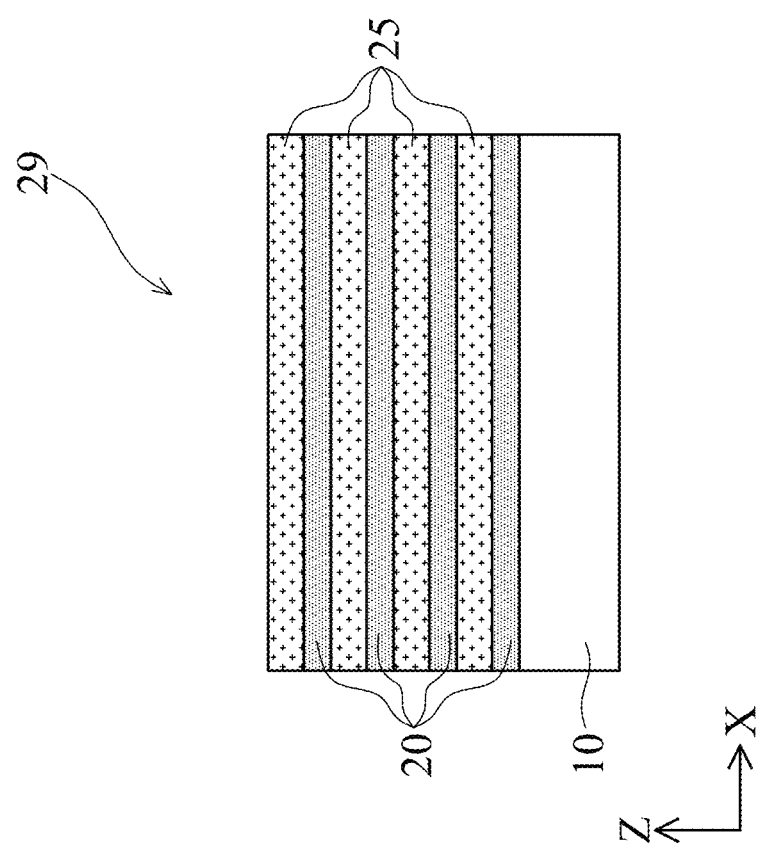
FIG. 5A-5E show one of the various stages of manufacturing a semiconductor GAA FET device according to an embodiment of the present disclosure.

As shown in FIG. 5A, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layer 25. Although four first semiconductor layers 20 and four second semiconductor layers 25 are shown in FIG. 5A, the numbers are not limited to four, and can be 1, 2, 3 or more than 4, and is less than 20. In some embodiments, the number of the first semiconductor layers 20 is greater by one than the number of the second semiconductor layers 25 (the top layer is the first semiconductor layer).

Figure 5B:
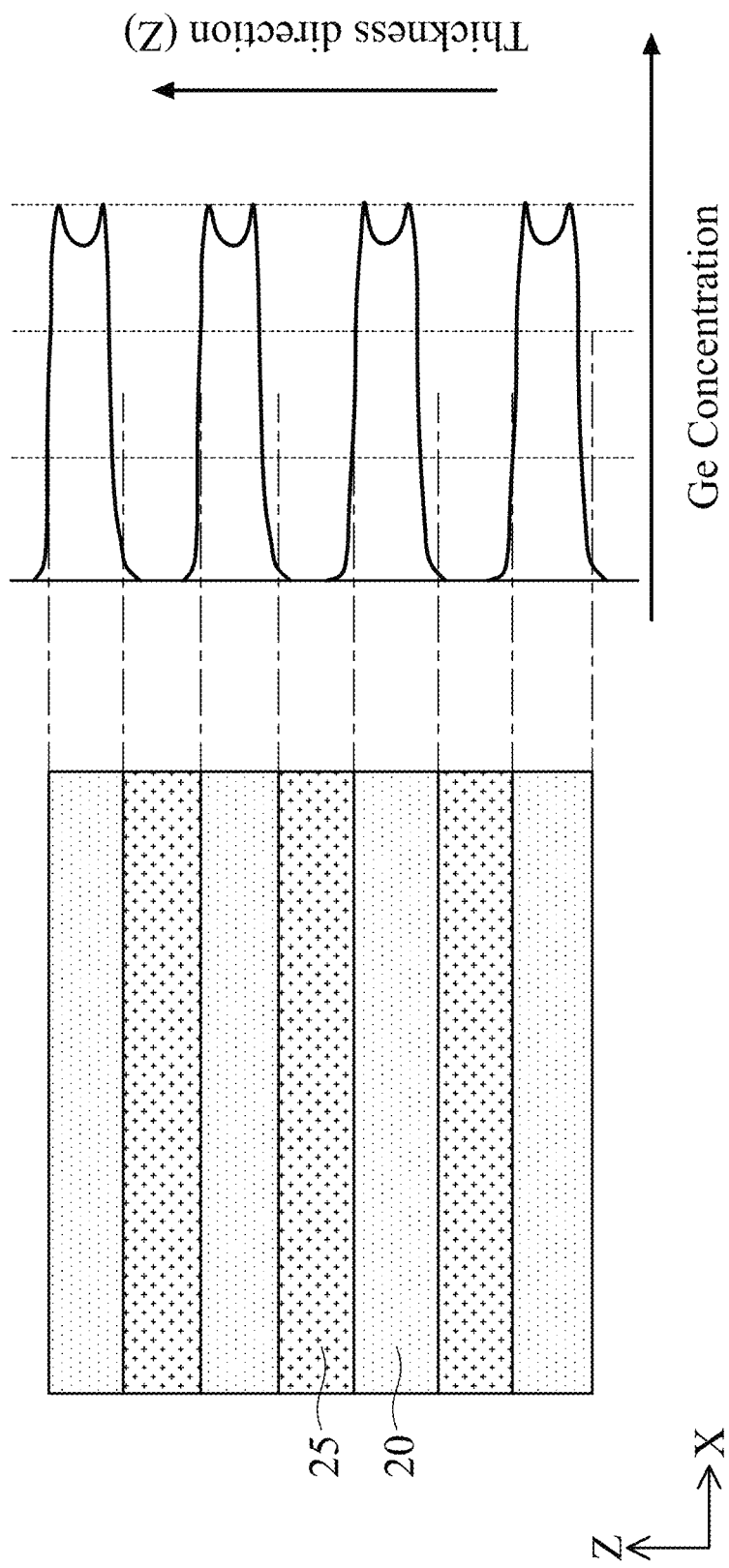

In some embodiments of the present disclosure, as shown in FIG. 5B, the composition of Ge (or Si) in each of the first semiconductor layers 20 varies. In some embodiments, the Ge concentration is smaller in the center region than edge regions along the thickness direction.

Figure 5D:
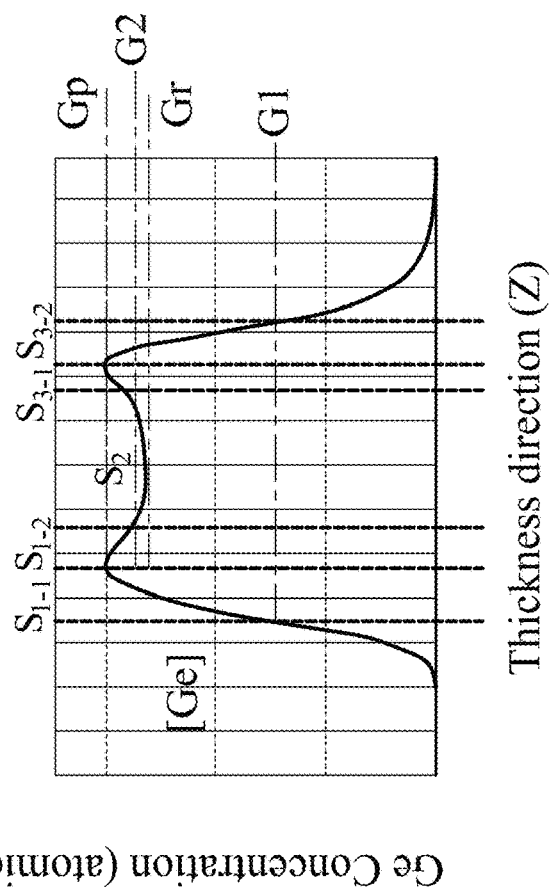
Figure 5C:
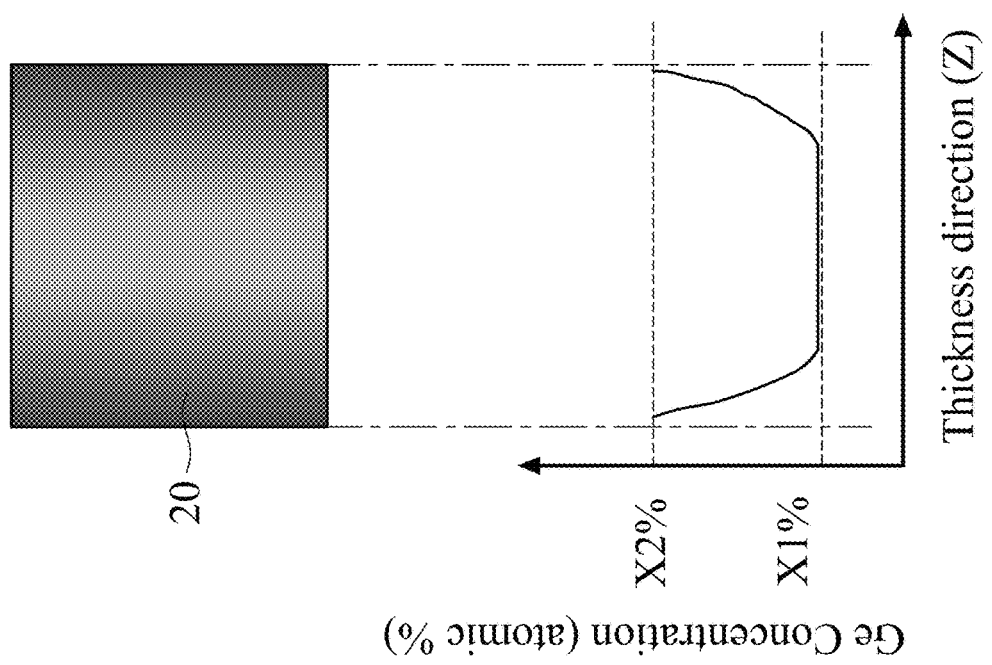

FIG. 5C shows a Ge concentration in one first semiconductor layer 20. In some embodiments, as shown in FIG. 5C, the Ge concentration has a substantially constant portion having a concentration X1 and the Ge concentration increases to X2 at the edges (interface to the second semiconductor layer 25). In some embodiments, the Ge concentration linearly increases, and in other embodiments, the Ge concentration increases gradually (not linear). In some embodiments, a Ge concentration at a center region is smaller than a Ge concentration at edge regions along the stacked direction, and a ratio of the Ge concentration at the center region to the Ge concentration at the edge region is equal to or more than 0.2 and less than 1.0. In other embodiments, the ratio is in a range from about 0.3 to about 0.7. In some embodiments, X1 is in a range from about 15% to about 35% and is in a range from about 20% to about 30% in other embodiments. In some embodiments, X2 is in a range from about 25% to about 50% and is in a range from about 30 to about 40 in other embodiments. When the Ge contents are within these ranged, it is possible to obtain a desired shape at the ends of the first semiconductor layers. In some embodiments, the thickness of the constant portion is about 20% to about 60% of the total thickness of one first semiconductor layer. In some embodiments, there is no constant portion and the Ge concentration has a U-shape or a V-shape profile along the thickness direction. In some embodiments, the Ge concentration is symmetric and in other embodiments, the Ge concentration is asymmetric, along the thickness direction with respect to the center of the first semiconductor layer.

FIG. 5D shows a Ge concentration in one first semiconductor layer 20 in other embodiments. As shown in FIG. 5D, the Ge concentration has two peaks. In some embodiments, the Ge concentration at the one peak is equal to or different from the Ge concentration of the other peak. The region S1-1 and S3-2 are regions from an edge (interface to the second semiconductor layer 25) to the peak portion, the regions S1-2 and S3-1 are regions from the peak portion to the substantially constant region S2. In some embodiments, the substantially constant portion S2 is a region having a Ge concentration variation of less than 2% (G2–Gr<2%). The constant or the minimum Ge concentration Gr in the constant region S2 is in a range from about 20% to about 30% in some embodiments. The peak concentration Gp is in a range from about 1.3×Gr to about 1.7×Gr. The Ge concentration G1 at the interface between the first semiconductor layer 20 and the second semiconductor layer 25 is in a range from about 0.1×Gr to about 0.5×Gr.

The thickness of the regions S1-1 and S3-2 is in a range from about 3 nm to about 10 nm and is in a range from about 4 nm to about 8 nm in other embodiments. The thickness of the regions S1-2 and S3-1 is in a range from about 3 nm to about 10 nm and is in a range from about 4 nm to about 8 nm in other embodiments. The thickness of the region S2 is in a range from about 5 nm to about 20 nm and is in a range from about 8 nm to about 15 nm in other embodiments. In some embodiments, the Ge concentration changes in a step-wise manner having, for example, two high Ge regions and one low Ge region, or two high Ge regions, two middle Ge regions and one low Ge region.

Figure 5E:
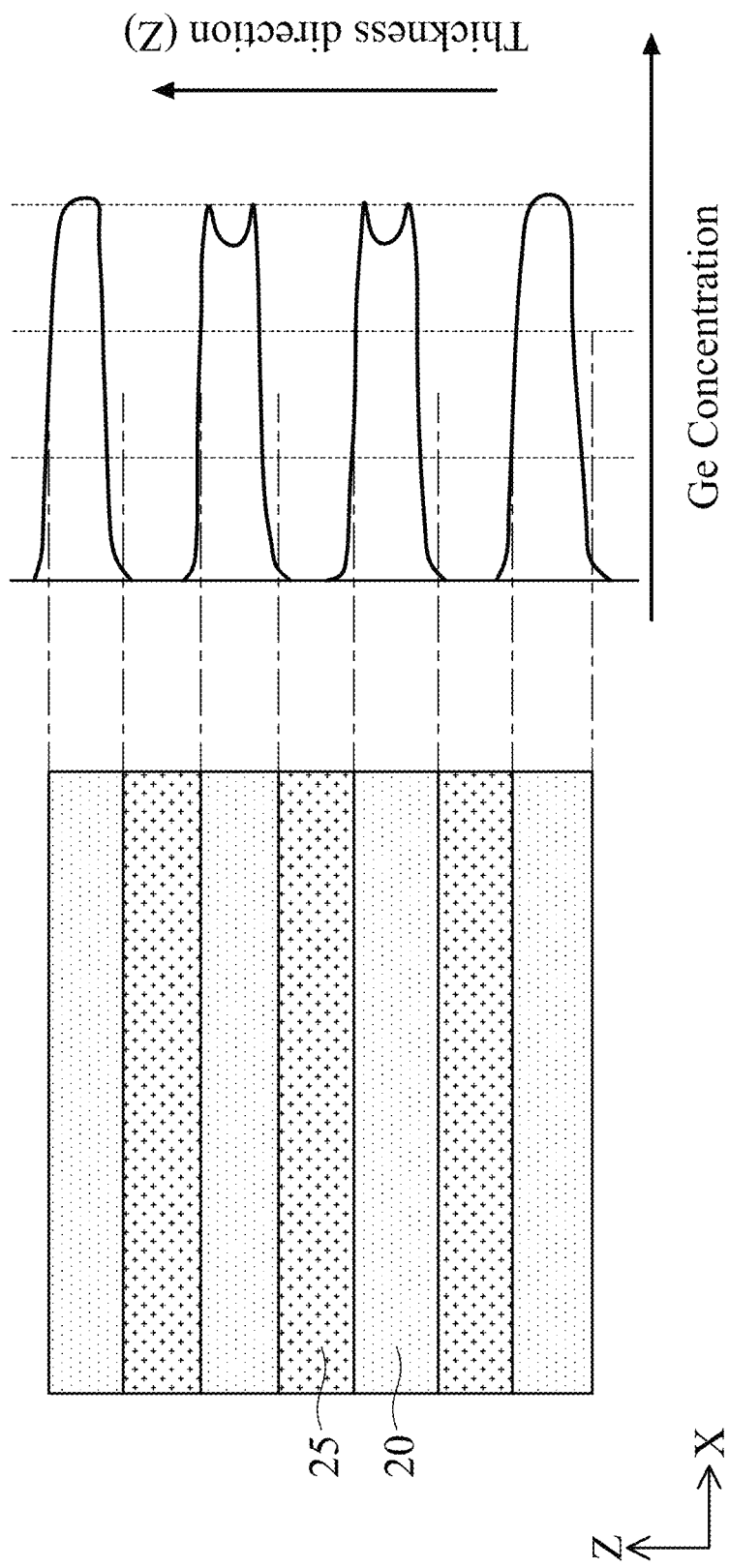

FIG. 5E shows a Ge concentration in the first semiconductor layers 20 in other embodiments. In this embodiment, at least one of the lowermost first semiconductor layer and the uppermost first semiconductor layer has a constant Ge concentration, while one or more middle first semiconductor layers have the variable Ge concentration as set forth above. In some embodiments, the uppermost first semiconductor layer has a smaller thickness than the remaining first semiconductor layers. In some embodiments, the uppermost second semiconductor layer has a smaller thickness than the remaining second semiconductor layers. In some embodiments, after a fin structure is formed as explained below, the uppermost first (and second) semiconductor layer is removed.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the Ge concentration is change by changing source gas flow rates, deposition pressure and/or deposition temperature. When the Ge concentration and/or the distribution are out of the aforementioned ranges, the selectivity of SiGe layer to Si in lateral etching as explained below is not sufficient (when the Ge concentration is low), and the desired end shape is not obtained (when the Ge concentration is high). In some embodiments, the Ge concentration is adjusted according to an etching conditions for lateral etching as explained below.

Figure 5F:
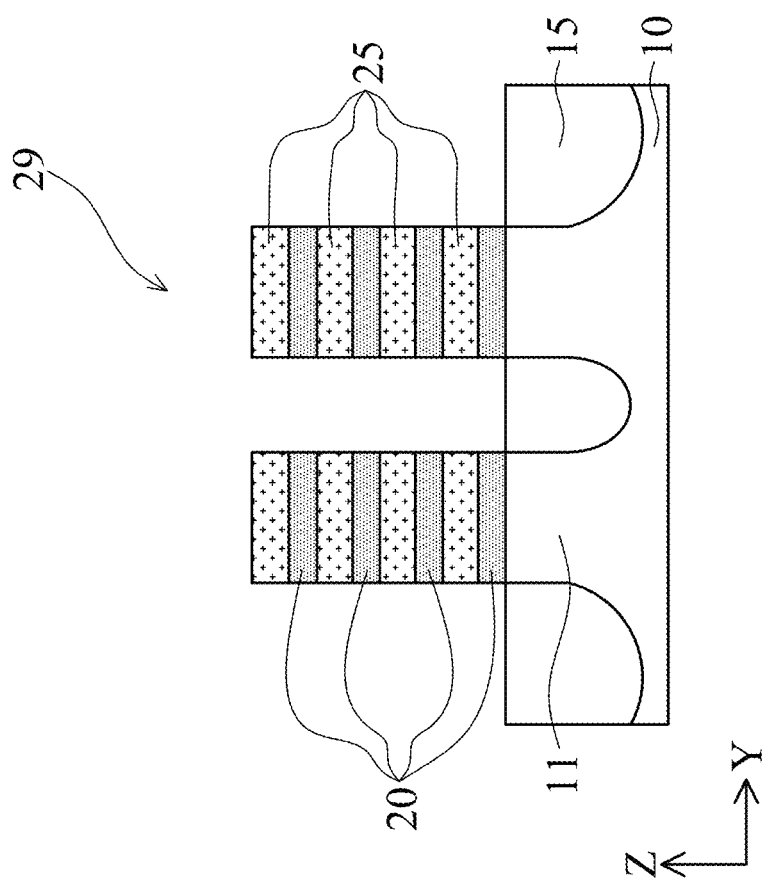
FIG. 5F shows one of the various stages of manufacturing a semiconductor GAA FET device according to an embodiment of the present disclosure.

After the stacked semiconductor layers are formed, fin structures are formed by using one or more lithography and etching operations, as shown in FIG. 5F. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 5F, the fin structures 29 extend in the X direction and are arranged in the Y direction. The number of the fin structures is not limited to two as shown in FIG. 5F, and may be as small as one and three or more. In some embodiments, one or more dummy fin structures are formed on both sides of the fin structures 29 to improve pattern fidelity in the patterning operations. As shown in FIG. 5F, the fin structures 29 have upper portions constituted by the stacked semiconductor layers 20, 25 and well portions 11.

The width of the upper portion of the fin structure 29 along the Y direction is in a range from about 10 nm to about 40 nm in some embodiments, and is in a range from about 20 nm to about 30 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one of more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 5F, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of an n-type GAA FET. For a p-type GAA FET, the second semiconductor layers 25 are sacrificial layers which are subsequently partially removed, and the first semiconductor layers 20 are subsequently formed into semiconductor wires as channel layers.

Figure 6A:
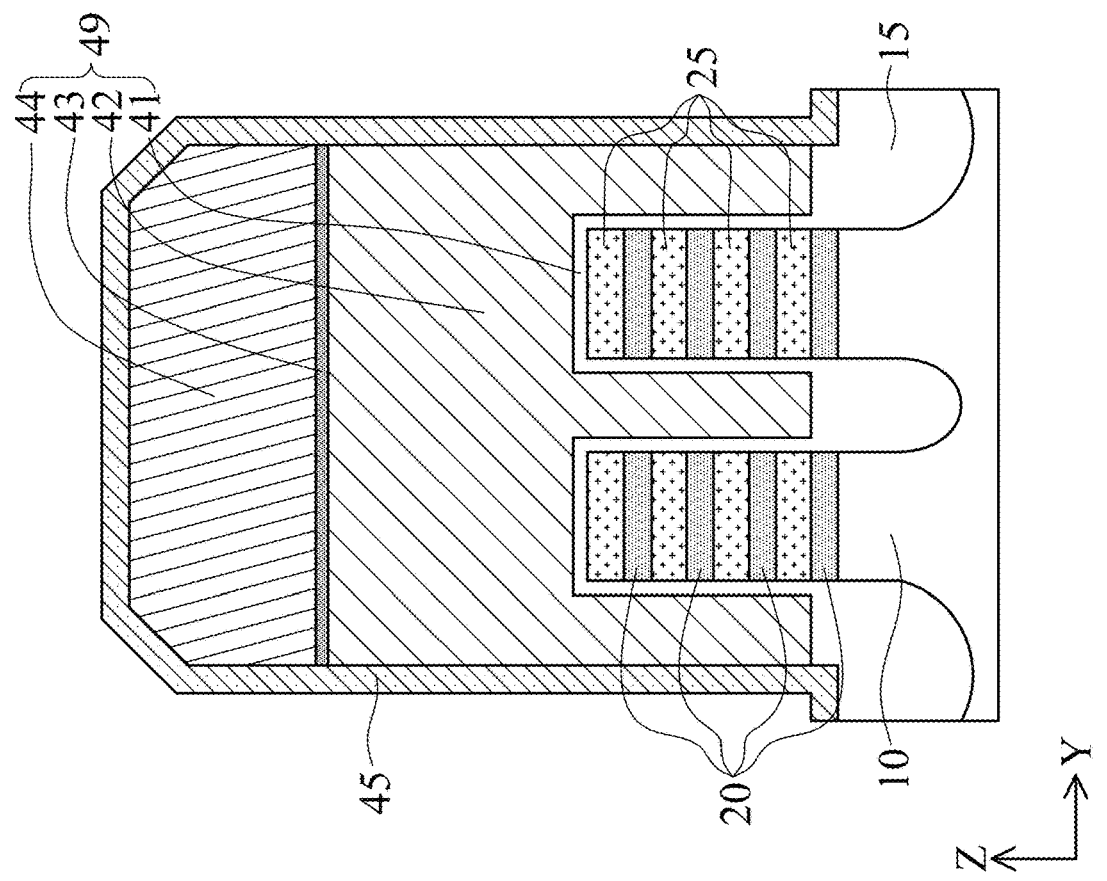
FIGS. 6A and 6B show one of the various stages of manufacturing a semiconductor GAA FET device according to an embodiment of the present disclosure.
Figure 6B:
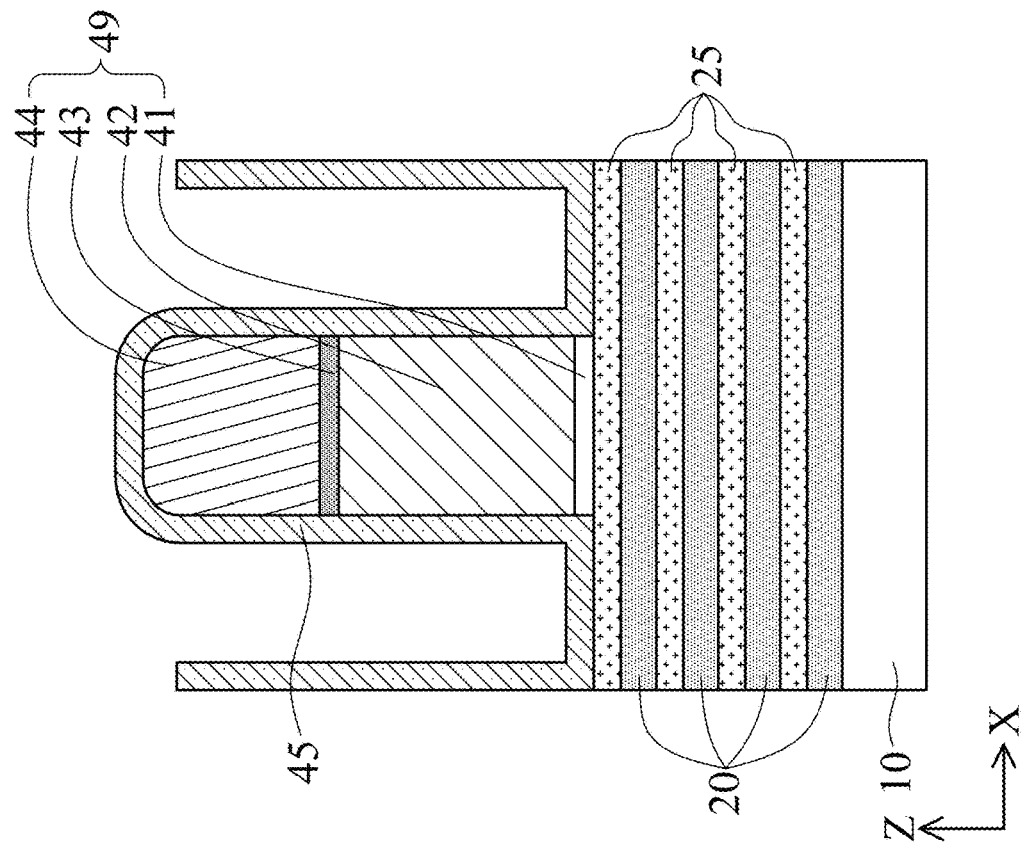

After the isolation insulating layer 15 is formed, a sacrificial (dummy) gate structure 49 is formed, as shown in FIGS. 6A and 6B. FIGS. 6A and 6B illustrate a structure after a sacrificial gate structure 49 is formed over the exposed fin structures 29. The sacrificial gate structure 49 is formed over a portion of the fin structures which is to be a channel region. The sacrificial gate structure 49 defines the channel region of the GAA FET. The sacrificial gate structure 49 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 49 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 49, as shown in FIGS. 6A and 6B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIGS. 6A and 6B. In this disclosure, a source and a drain are interchangeably used and the structures thereof are substantially the same. In FIGS. 6A and 6B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for sidewall spacers is formed over the sacrificial gate structure 49, as shown in FIGS. 6A and 6B. The first cover layer 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, SiON, SiCN, SiCO, SiOCN or any other suitable dielectric material. The cover layer 45 can be formed by ALD or CVD, or any other suitable method.

Figure 7A:
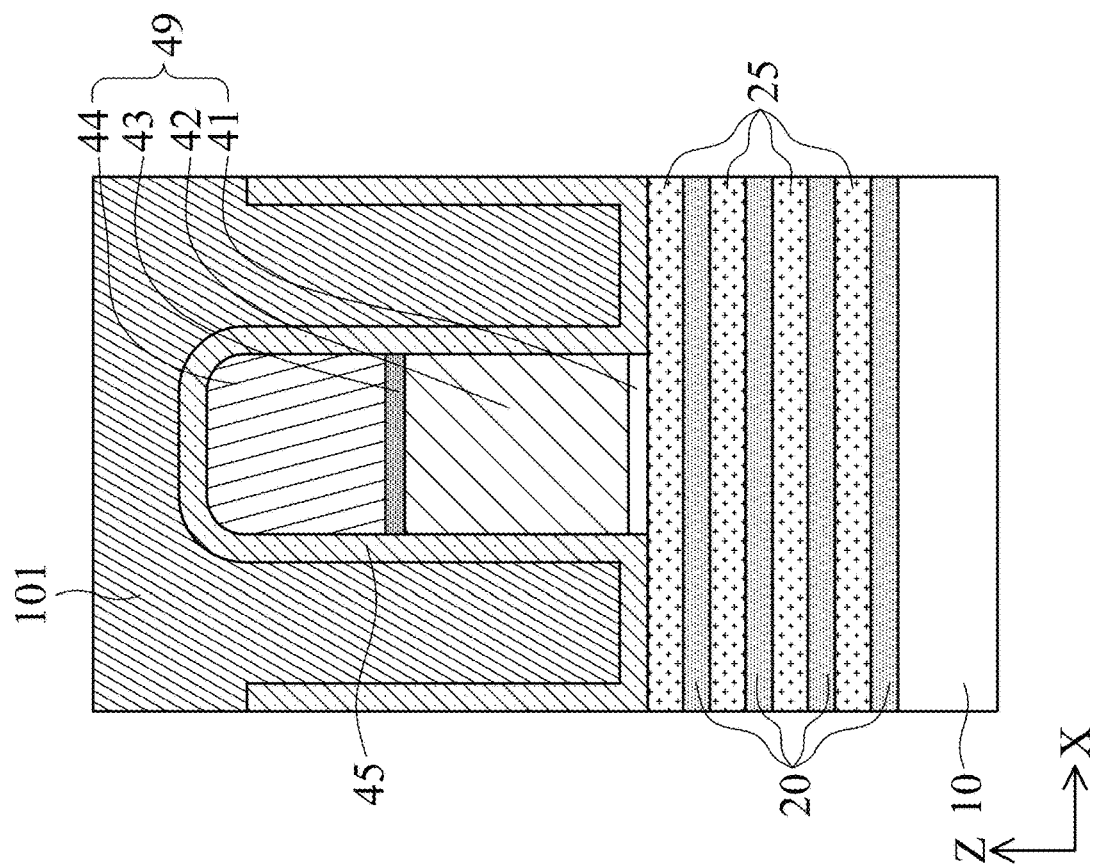
FIGS. 7A and 7B show one of the various stages of manufacturing a semiconductor GAA FET device according to an embodiment of the present disclosure.
Figure 7B:
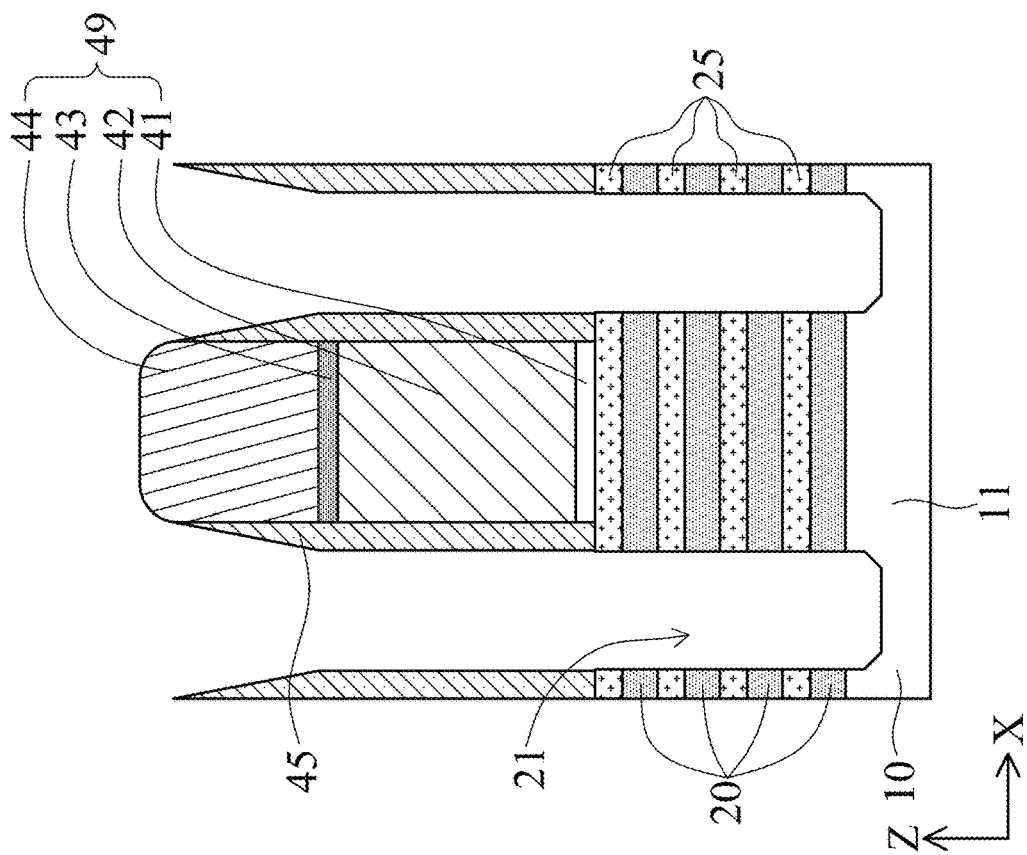

FIG. 7A shows a cross sectional view along the X direction in an n-type region, and FIG. 7B shows a cross sectional view along the X direction in a p-type region. Next, as shown in FIGS. 7A and 7B, in the n-type region, the first cover layer 45 is anisotropicaly etched to remove the first cover layer 45 disposed on the source/drain region, while leaving the first cover layer 45 as sidewall spacers on side faces of the sacrificial gate structure 49. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part of the fin structures 11) is also partially etched. The p-type region is covered by a protective layer 101, such a photo resist layer, as shown in FIG. 7B.

Further, as shown in FIGS. 8A-8C, the first semiconductor layers 20 are laterally etched in the X direction within the source/drain space 21, thereby forming cavities 22. FIG. 8C is an enlarged view of the area A2 of FIG. 8A.

The lateral amount D22 of etching of the first semiconductor layer 20 is in a range from about 0.9 nm to about 11 nm in some embodiments, and is in a range from about 2 nm to about 7 nm in other embodiments.

When the first semiconductor layers 20 are SiGe and the second semiconductor layers 25 are Si, the first semiconductor layers 20 can be selectively etched by isotropic etching, such as wet etching. A wet etchant includes a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments.

By using the repeating etching by the mixed solution, the end of the first semiconductor layer 20 has a curved shape as shown in FIG. 8C. In some embodiments, the depth D22, which is an area in which the first semiconductor layer is fully removed, is in a range from about 0.5 nm to about 5 nm and is in a range from about 1 nm to about 3 nm in other embodiments.

If the first semiconductor layer 20 is made of SiGe having a constant Ge concentration, the wet etching causes more etching at the center portion than the edge portions in the vertical direction due to surface tension and capillary action, and thus the end of the first semiconductor layer has a smiling shape having a deep center etching. However, since the Ge concentration at the center region is smaller than the edge portions as shown in FIGS. 5B-5D, the etching rate at the center region is smaller than the etching rate at the edge portions. Accordingly, the smiling shape of the end of the first semiconductor layer 20 can be suppressed, and the curved portion (D21-D22) can be reduced.

After the lateral etching, the protective layer 101 in the p-type region is removed.

Figure 9A:
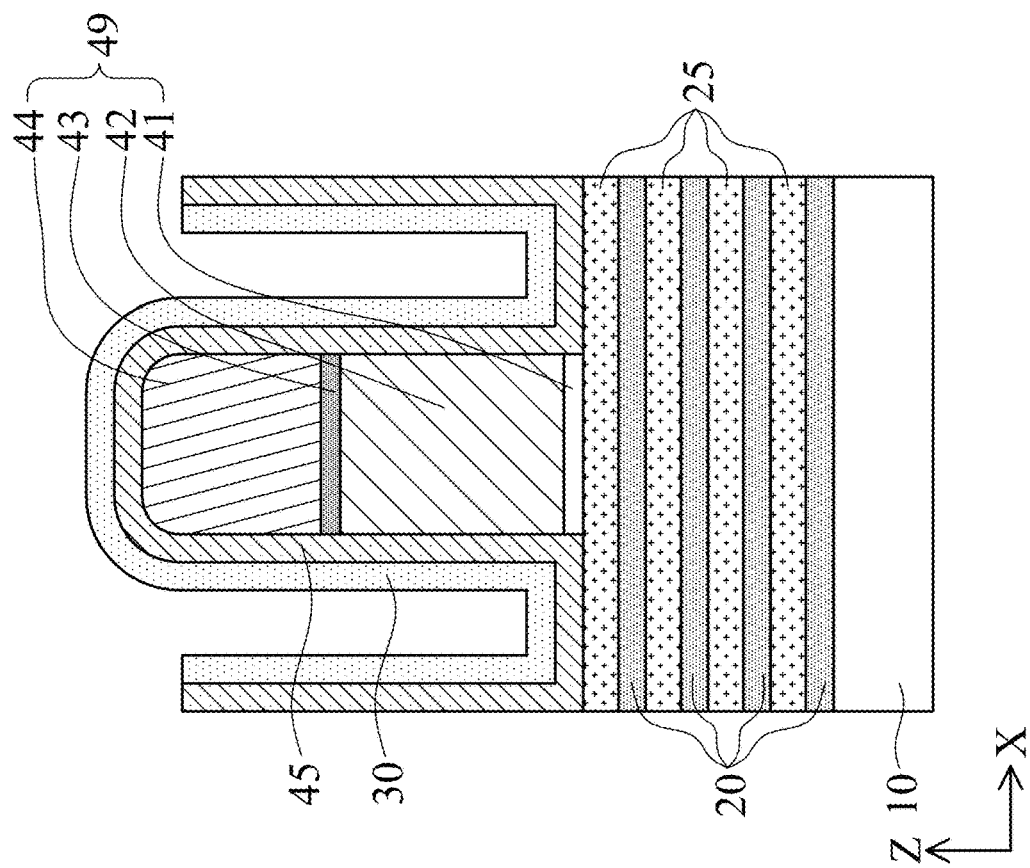
FIGS. 9A and 9B show one of the various stages of manufacturing a semiconductor GAA FET device according to an embodiment of the present disclosure.
Figure 9B:
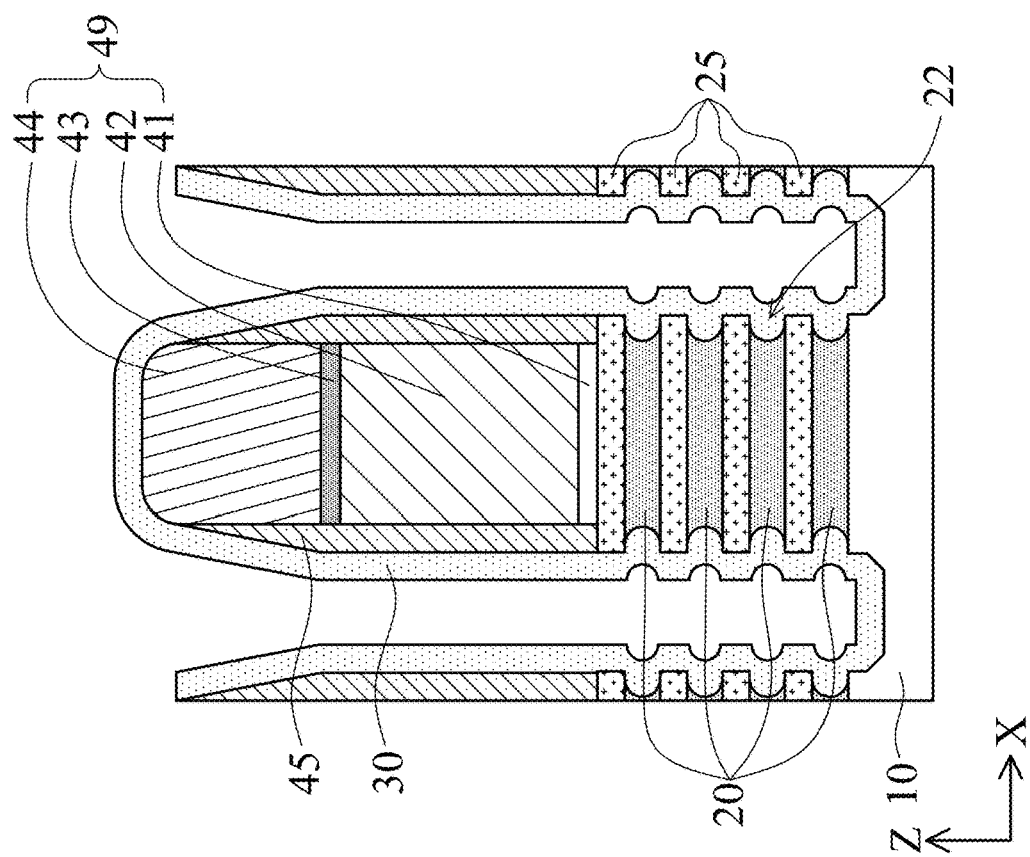

As shown in FIG. 9A, a first insulating layer 30 is conformally formed on the etched lateral ends of the first semiconductor layers 20 and on end faces of the second semiconductor layers 25 in the source/drain space 21 and over the sacrificial gate structure. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 are fully filled with the first insulating layer 30. In the p-type region, the first insulating layer 30 is formed on the first cover layer 45, as shown in FIG. 9B.

Figure 10B:
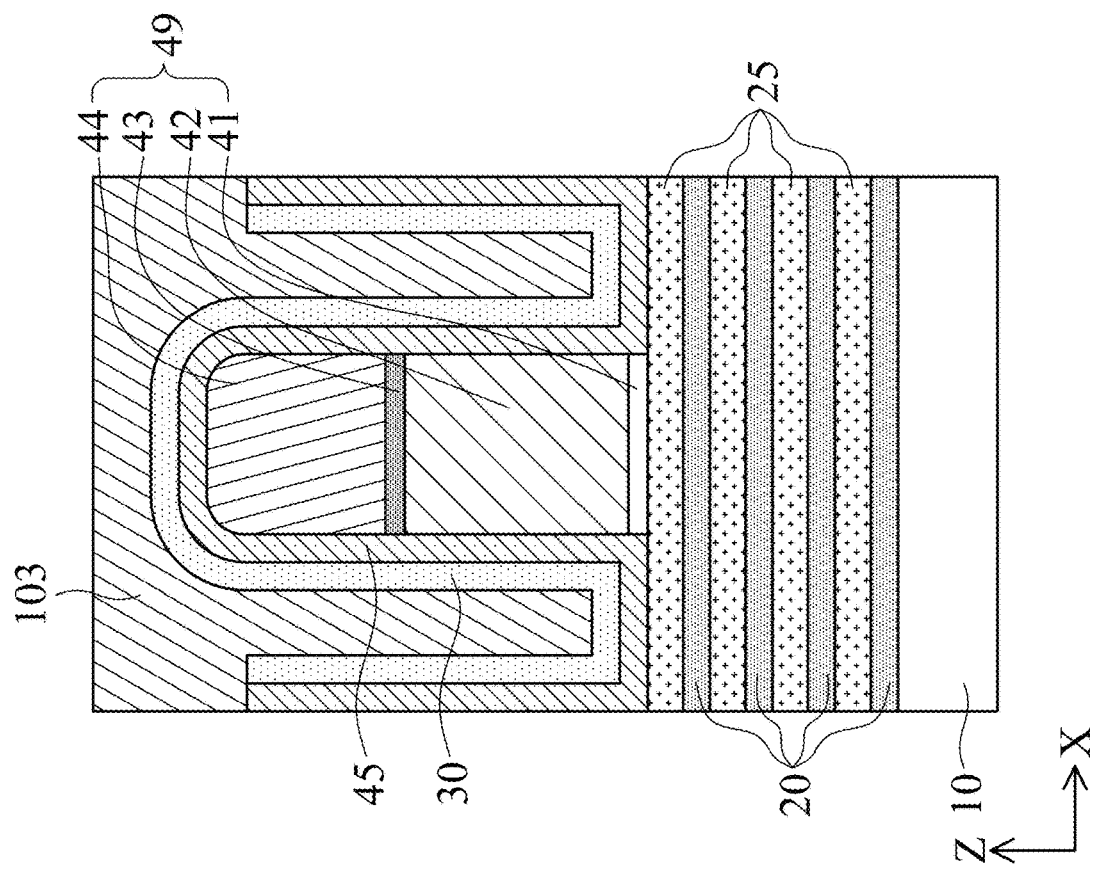
FIGS. 10A and 10B show one of the various stages of manufacturing a semiconductor GAA FET device according to an embodiment of the present disclosure.
Figure 10A:
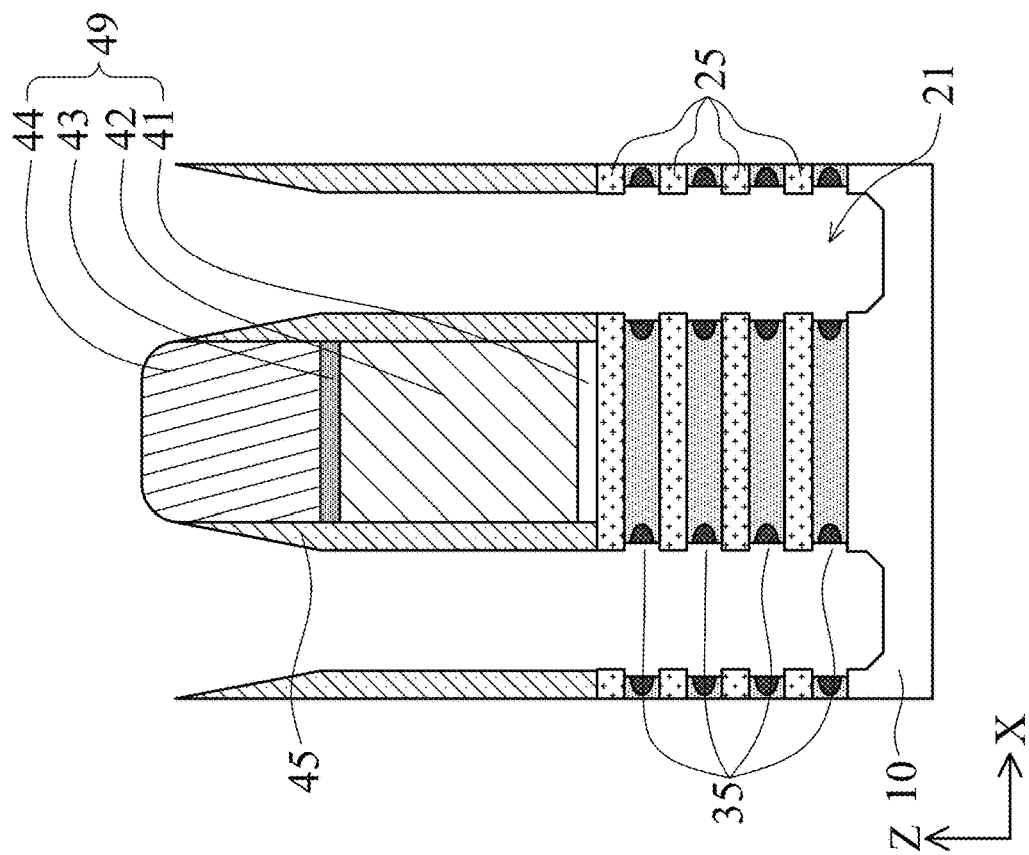

After the first insulating layer 30 is formed, an etching operation is performed to partially remove the first insulating layer 30, thereby forming inner spacers 35, as shown in FIG. 10A. In some embodiments, the p-type region is covered by a protective layer 103, for example, a photo resist pattern, as shown in FIG. 10B. In other embodiments, the protective layer 103 is not used, and in such a case, the first insulating layer 30 in the p-type region is simultaneously removed during the etching operation performed in the n-type region. In some embodiments, the end face of the inner spacers 35 is recessed more than the end face of the second semiconductor layers 25 as shown in FIG. 10A. The recessed amount is in a range from about 0.2 nm to about 3 nm and in in a range from about 0.5 nm to about 2 nm in other embodiments. In other embodiments, the recessed amount is less than 0.5 nm and may be equal to zero (the end face of the inner spacer 35 and the end face of the second semiconductor layers 25 are flush with each other).

In some embodiments, before forming the first insulating layer 30, an additional insulating layer having a smaller thickness than the first insulating layer 30 is formed, and thus the inner spacers 35 have a two-layer structure.

Figure 11B:
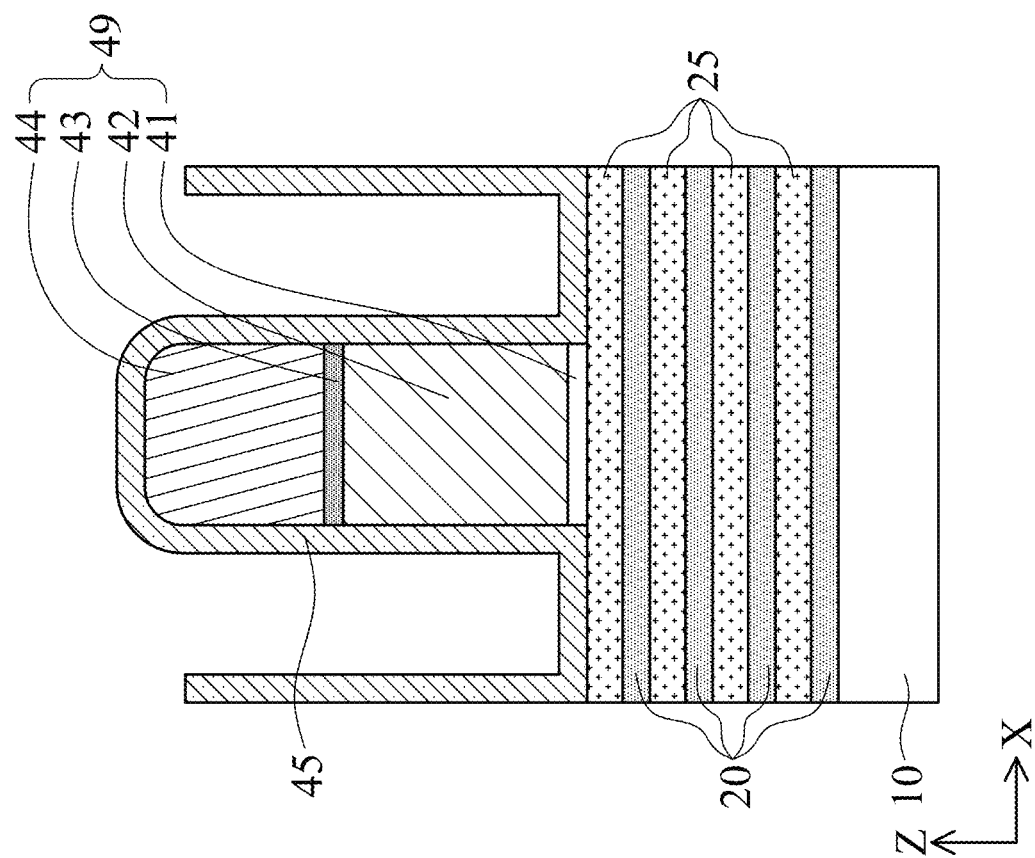
FIGS. 11A and 11B show one of the various stages of manufacturing a semiconductor GAA FET device according to an embodiment of the present disclosure.
Figure 11A:
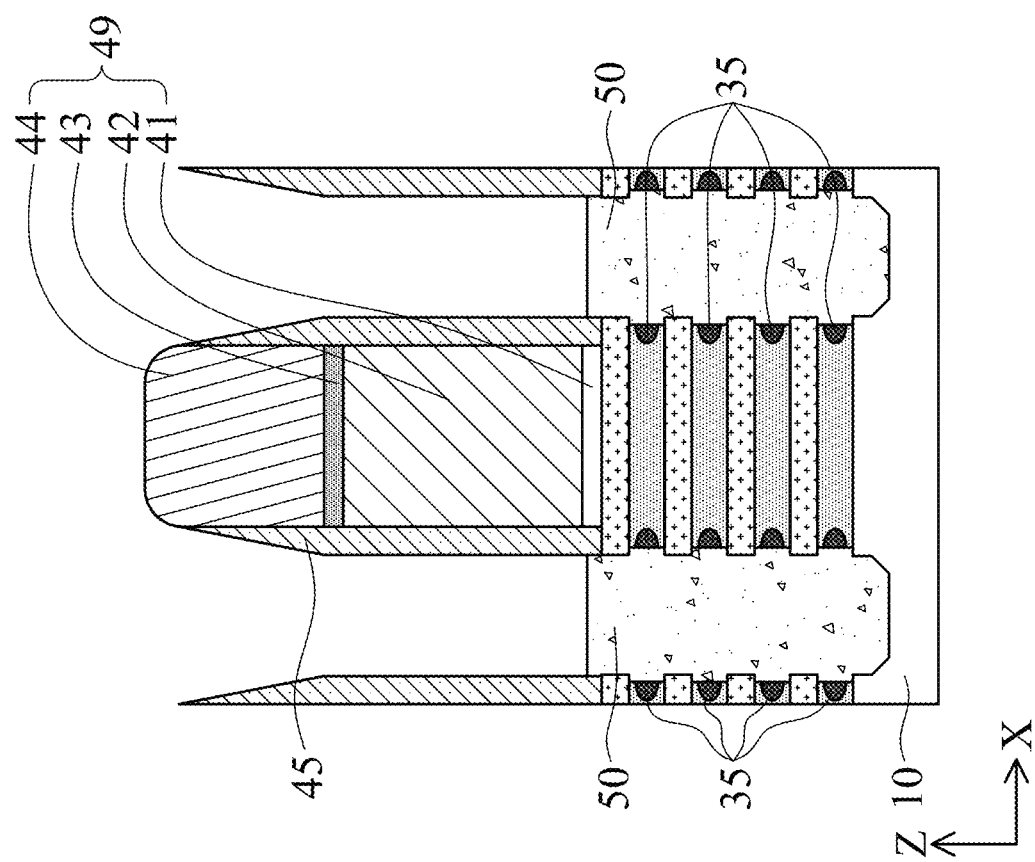

Subsequently, as shown in FIG. 11A, a source/drain epitaxial layer 50 is formed in the source/drain space 21, in the n-type region. The source/drain epitaxial layer 50 includes one or more layers of Si, SiP, SiC and SiCP for an n-channel FET. The source/drain epitaxial layer 50 is formed by an epitaxial growth method using CVD, ALD or molecular beam epitaxy (MBE). As shown in FIGS. 11A and 11B, the source/drain epitaxial layer 50 is selectively formed on semiconductor regions. The source/drain epitaxial layer 50 is formed in contact with end faces of the second semiconductor layers 25, and formed in contact with the inner spacers 35.

Then, as shown in FIGS. 12A and 12B, a second cover layer 47 is formed both in the n-type region and the p-type region. The second cover layer 47 includes one of silicon nitride and silicon oxide, SiON, SiOC, SiCN and SiOCN, or any other suitable dielectric material. The second cover layer 47 is made of a different material than the sidewall spacers (first cover layer) 45. The second insulating layer 47 can be formed by ALD or any other suitable methods.

Figure 13B:
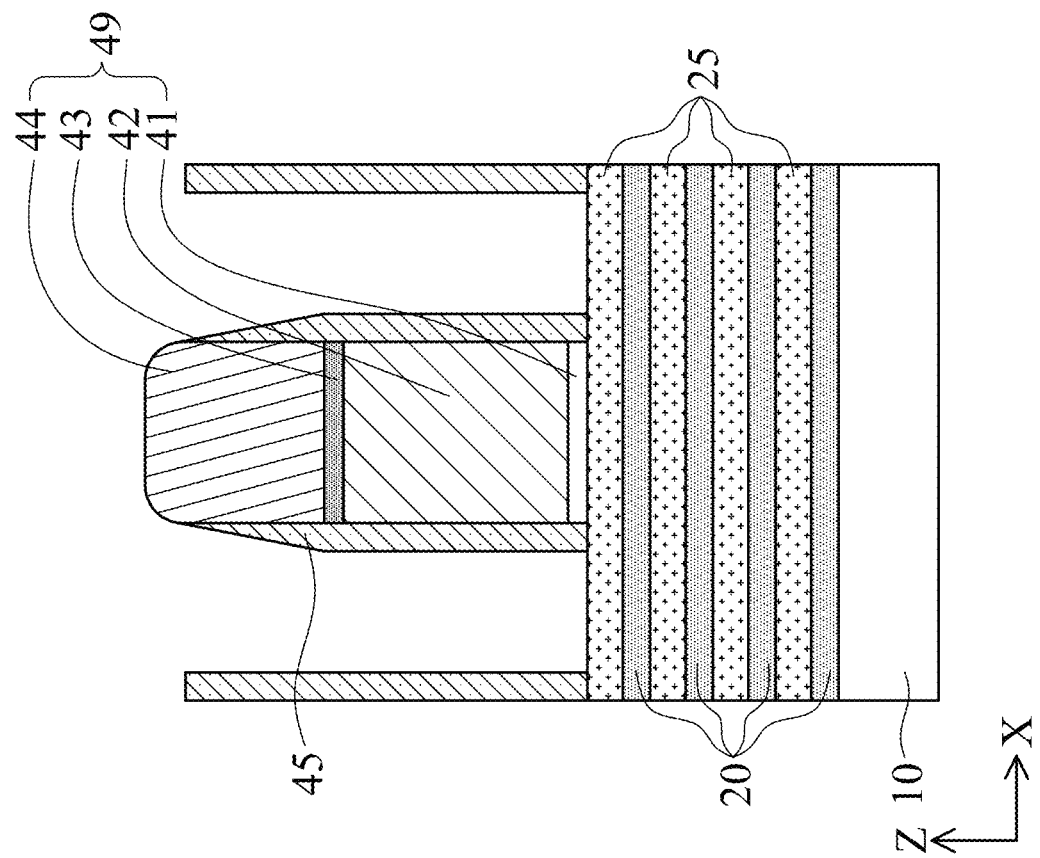
FIGS. 13A and 13B show one of the various stages of manufacturing a semiconductor GAA FET device according to an embodiment of the present disclosure.
Figure 13A:
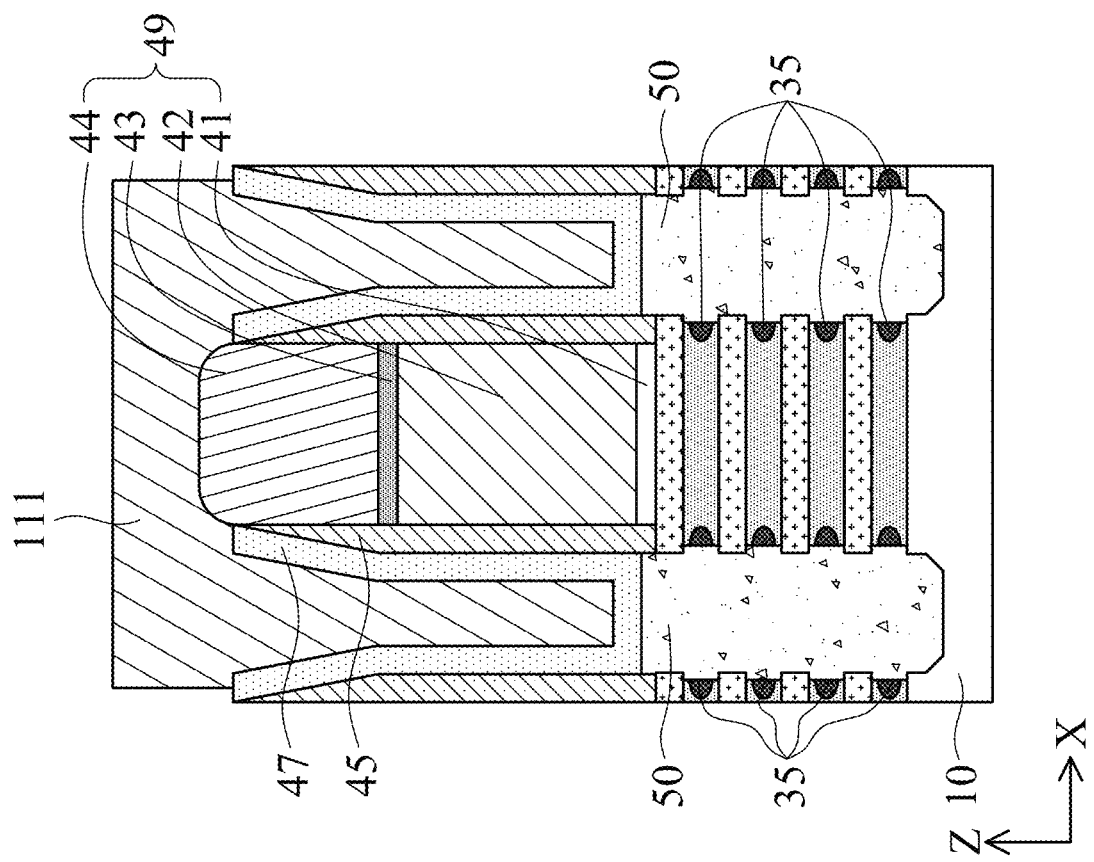

Next, as shown in FIGS. 13A and 13B, while the n-type region is covered by a protective layer 111, for example, a photo resist pattern, the second cover layer 47 is removed from the p-type region. Further, the first cover layer 45 is anisotropicaly etched to remove the first cover layer 45 disposed on the source/drain region, while leaving the first cover layer 45 as sidewall spacers on side faces of the sacrificial gate structure 49 in the p-type region.

Figure 14A:
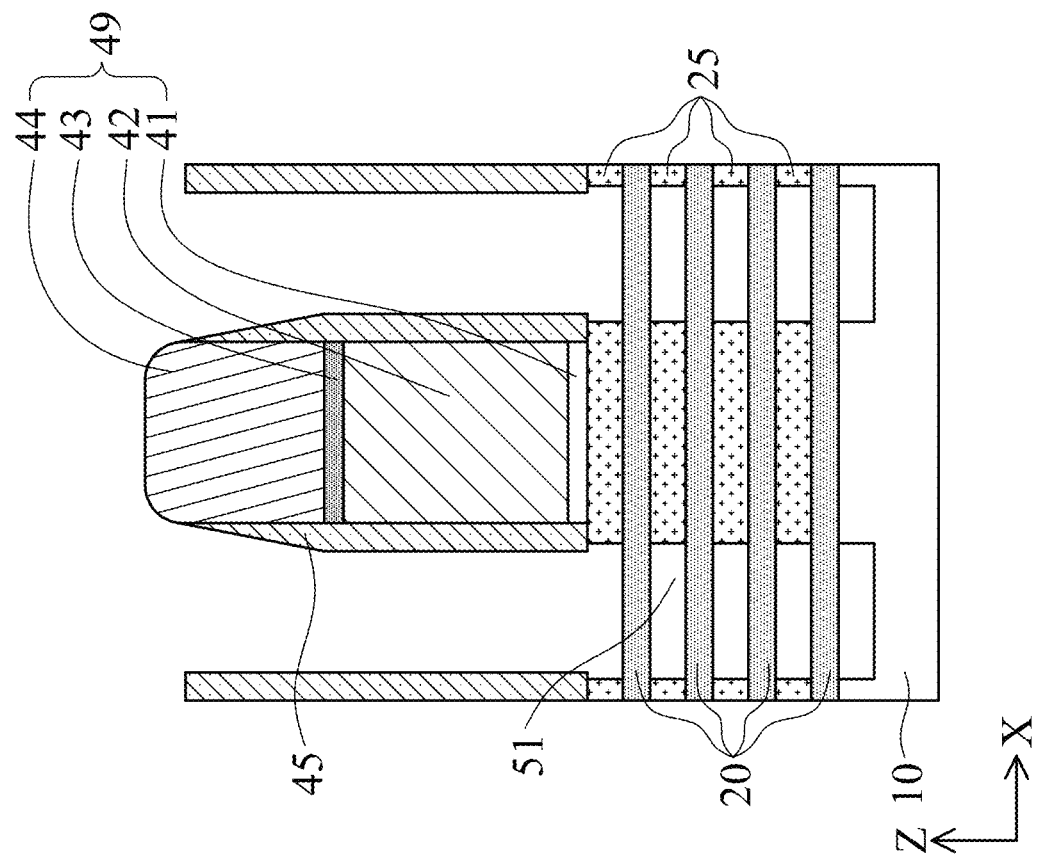
FIGS. 14A and 14B show one of the various stages of manufacturing a semiconductor GAA FET device according to an embodiment of the present disclosure.
Figure 14B:
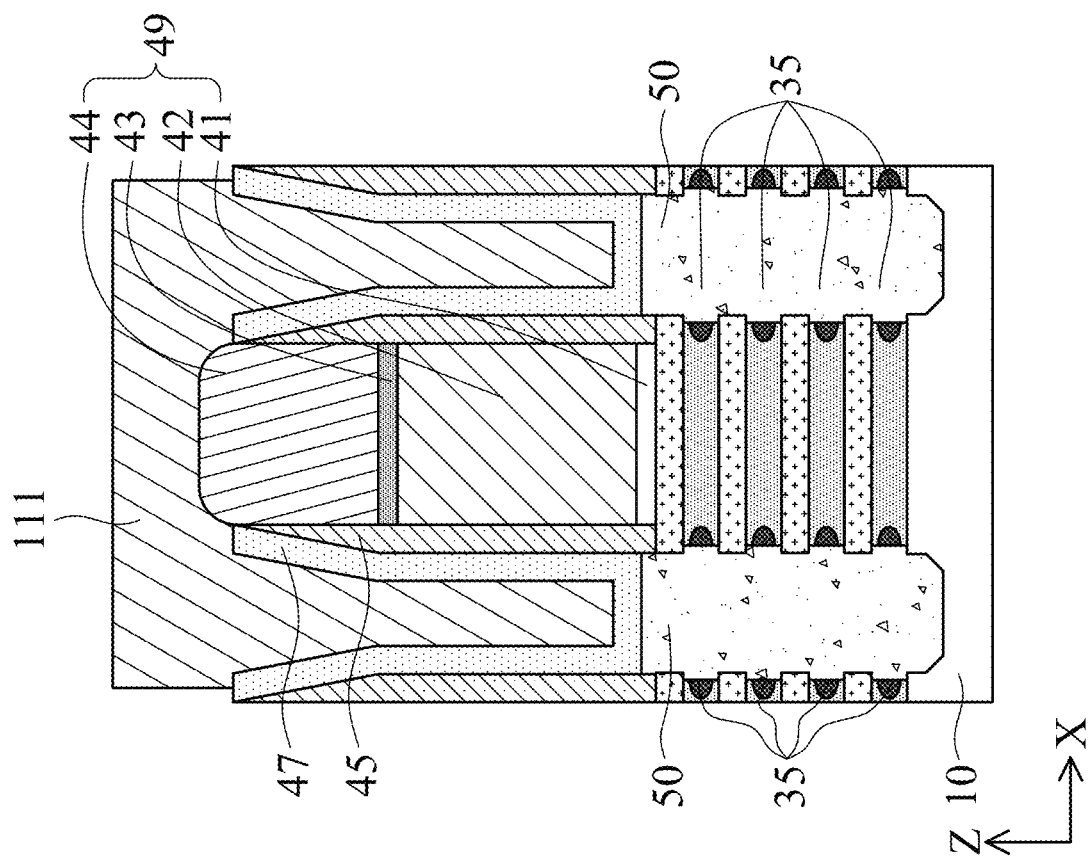

Further, as shown in FIG. 14B, the second semiconductor layer 25 in the source/drain region of the fin structure, which is not covered by the sacrificial gate structure, is etched, thereby leaving the first semiconductor layers 20 remaining in the source/drain region. The n-type region is covered by the protective layer 111 in some embodiments, as shown in FIG. 14A. In other embodiments, the protective layer 111 is removed before etching the source/drain region in the p-type region, and the second cover layer 47 protects the n-type region.

In addition, the second semiconductor layers 25 are laterally etched in the X direction within the source/drain space 51, thereby forming cavities 52, as shown in FIG. 15B. The amount of etching of the second semiconductor layer 25 is in a range from about 2 nm to about 10 nm in some embodiments. When the first semiconductor layers 20 are SiGe and the second semiconductor layers 25 are Si, the second semiconductor layers 25 can be selectively etched by using a wet etchant such as, but not limited to, an ammonium hydroxide (NH$_4$OH) solution and/or a tetramethylammonium hydroxide (TMAH) solution. The end of the second semiconductor layers 25 have a curved (convex) shaper in some embodiments. In other embodiments, the end of the second semiconductor layer 25 has a V-shape (90 degree rotated) or a substantially triangular shape. After the lateral etching, the protective layer 111, if remaining at this stage, in the p-type region is removed.

Figure 16B:
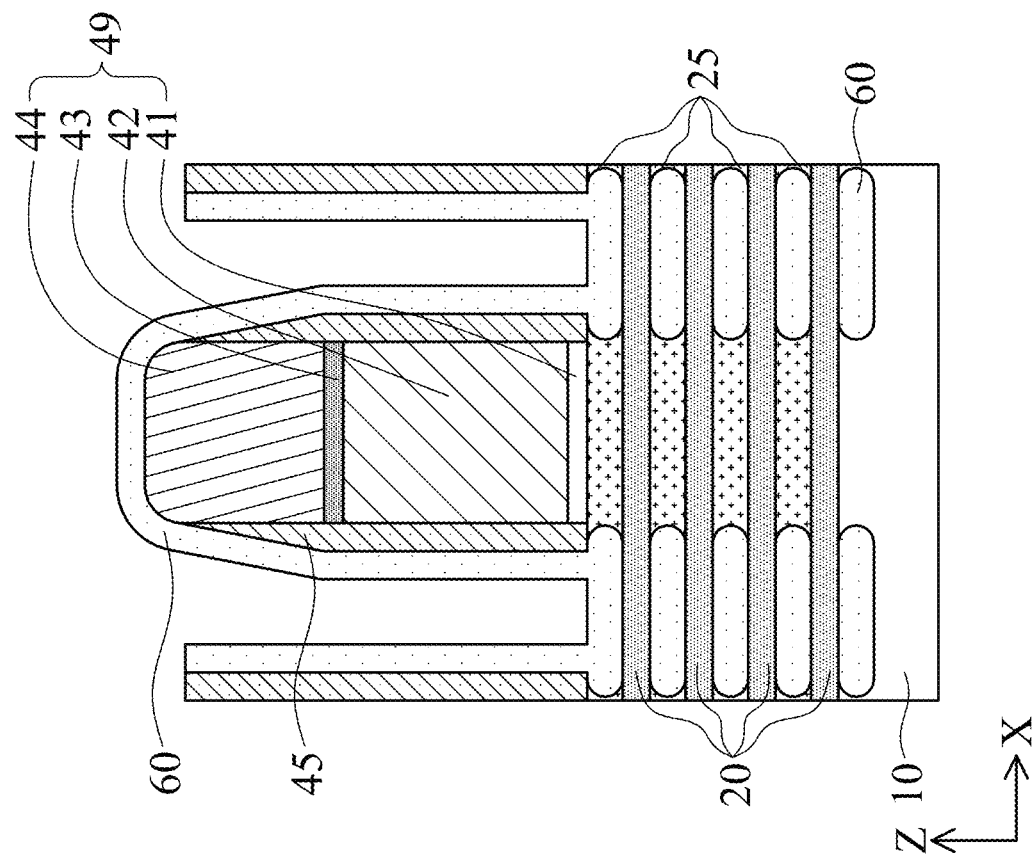
FIGS. 16A and 16B show one of the various stages of manufacturing a semiconductor GAA FET device according to an embodiment of the present disclosure.
Figure 16A:
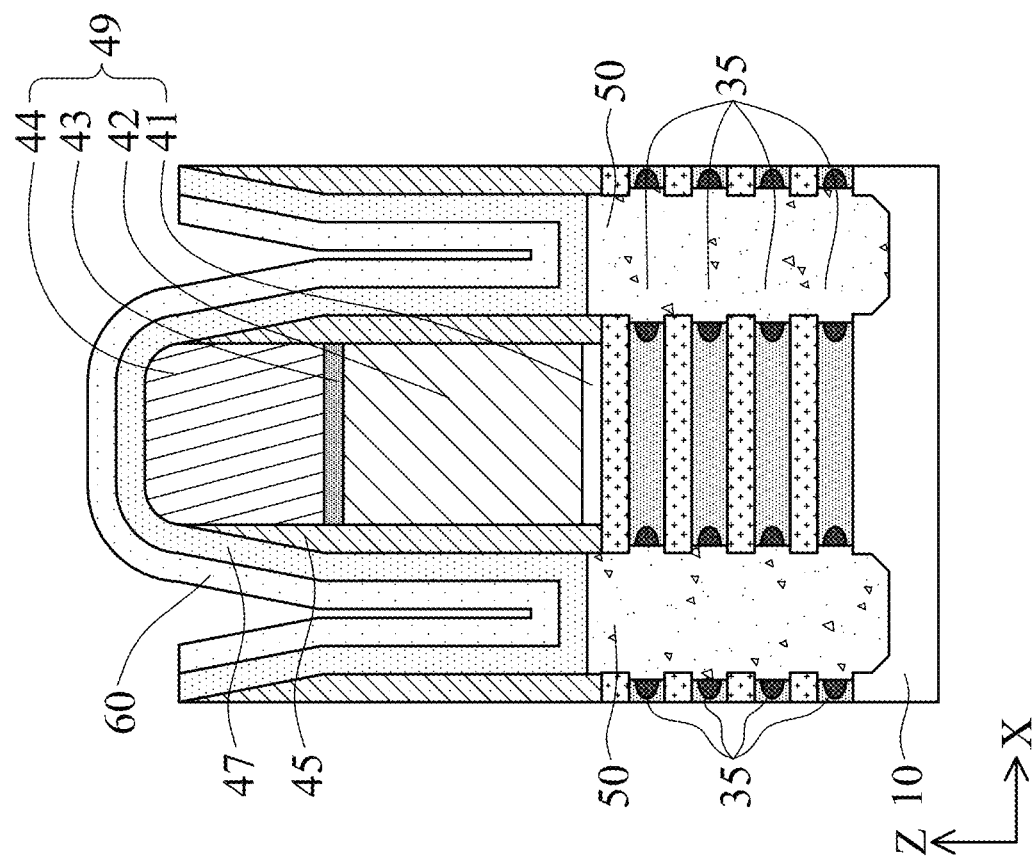

Then, as shown in FIGS. 16A and 16B, a second insulating layer 60 is formed over both the p-type region and the n-type region. In some embodiments, the second insulating layer 60 fully fills the source/drain space 51 between the adjacent first semiconductor layers 20. The second insulating layer 60 includes one of silicon nitride and silicon oxide, SiON, SiOC, SiCN and SiOCN, or any other suitable dielectric material. The second insulating layer 60 is made of a different material than the sidewall spacers (first cover layer) 45. The second insulating layer 60 has a thickness in a range from about 1.0 nm to about 10.0 nm. In other embodiments, the second insulating layer 60 has a thickness in a range from about 2.0 nm to about 5.0 nm. The second insulating layer 60 can be formed by ALD or any other suitable methods. By forming the second insulating layer 60, the cavity 52 is fully filled with the second insulating layer 60. In the n-type region, the second insulating layer 60 is formed on the second cover layer 47, as shown in FIG. 16B.

Figure 17A:
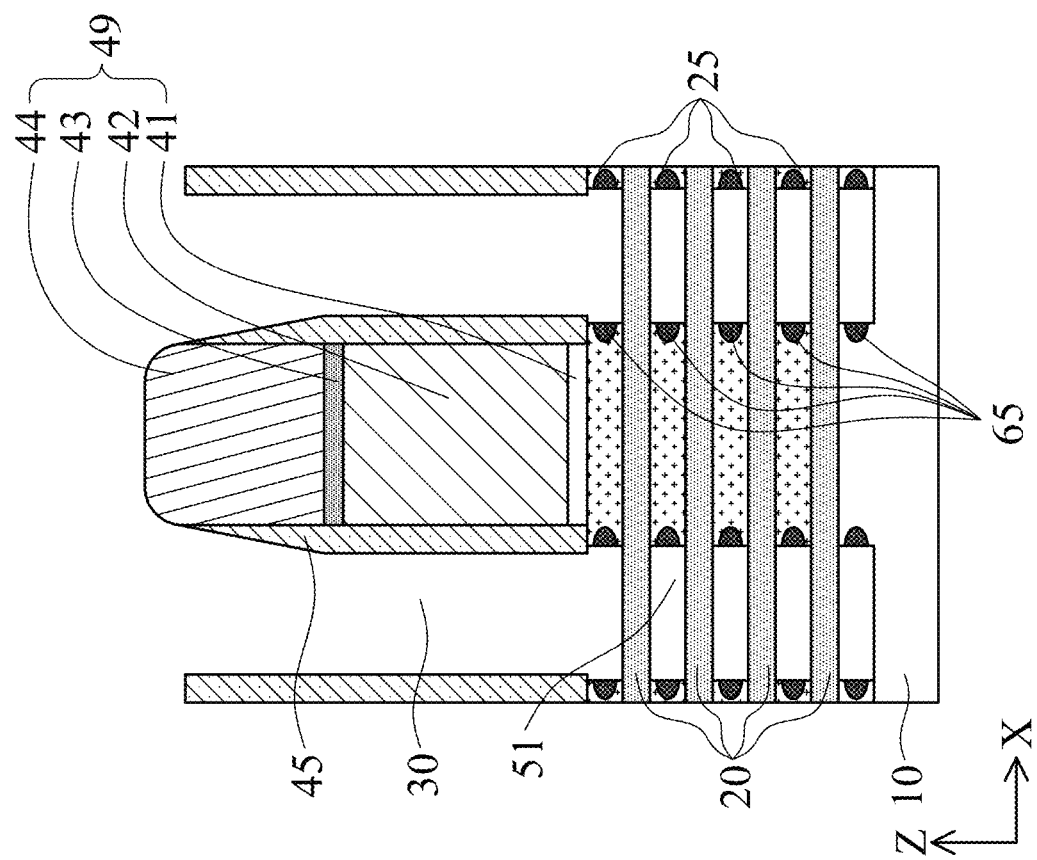
FIGS. 17A and 17B show one of the various stages of manufacturing a semiconductor GAA FET device according to an embodiment of the present disclosure.
Figure 17B:
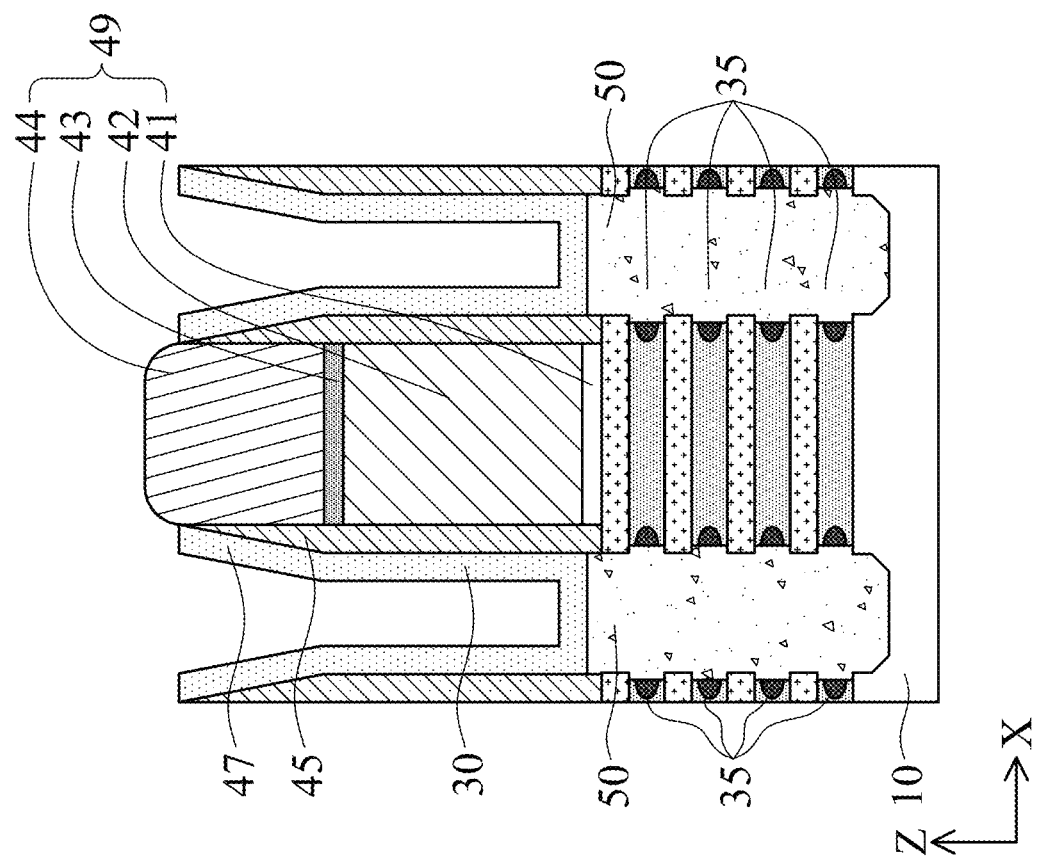

After the second insulating layer 60 is formed, an etching operation is performed to partially remove the second insulating layer 60, thereby forming inner spacers 65, as shown in FIG. 17B, while the n-type region is covered by the second cover layer 47, as shown in FIG. 17A. In some embodiments, before forming the second insulating layer 60, an additional insulating layer having a smaller thickness than the second insulating layer 60 is formed, and thus the inner spacers 65 has a two-layer structure.

Subsequently, as shown in FIGS. 18A and 18B, a source/drain epitaxial layer 55 is formed in the source/drain space 51, in the p-type region. The source/drain epitaxial layer 55 includes one or more layers of Si, SiGe and Ge for a p-channel FET. For the P-channel FET, boron (B) may also be contained in the source/drain. The source/drain epitaxial layer 55 is formed by an epitaxial growth method using CVD, ALD or molecular beam epitaxy (MBE). The source/drain epitaxial layer 55 is formed to wrap around end portions of the first semiconductor layers 20, and formed in contact with the inner spacers 65. In some embodiments, the first semiconductor layers 20 pass through the source/drain epitaxial layer 55. After the source/drain epitaxial layer 55 is selectively formed on semiconductor regions in the p-type region, the second cover layer 47 in the n-type region is removed, as shown in FIG. 18A.

Subsequently, an interlayer dielectric (ILD) layer 70 is formed over the source/drain epitaxial layers 50 and 55. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed.

Then, the sacrificial gate electrode layer 42 and sacrificial gate dielectric layer 41 are removed. The ILD layer 70 protects the source/drain epitaxial layers 50 and 55 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Figure 19A:
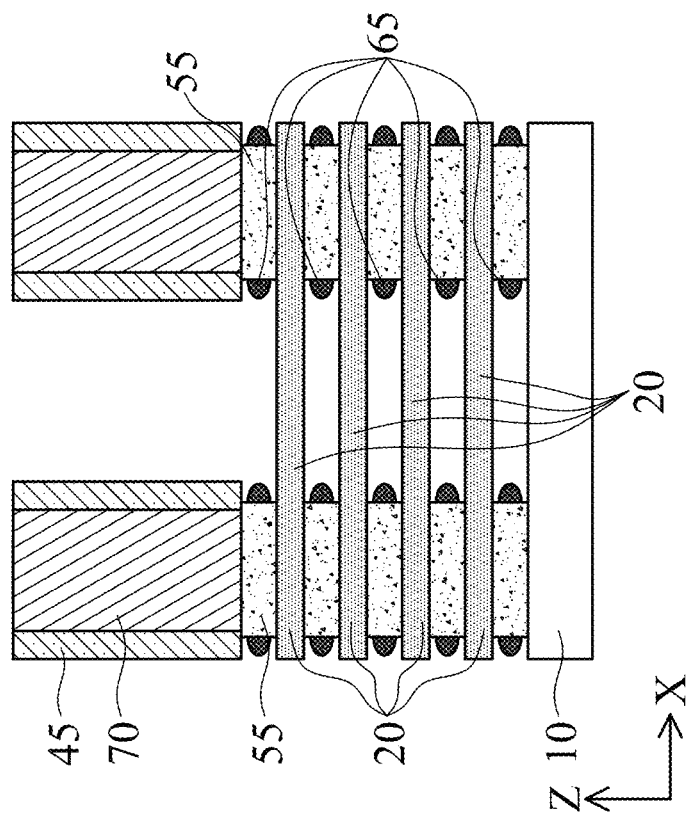
FIGS. 19A and 19B show one of the various stages of manufacturing a semiconductor GAA FET device according to an embodiment of the present disclosure.

After the sacrificial gate structures are removed, the first semiconductor layers 20 are removed in the n-type region, thereby forming wires (channel regions) of the second semiconductor layers 25, as shown in FIG. 19A. The first semiconductor layers 20 can be removed or etched using an etchant that can selectively etch the first semiconductor layers 20 against the second semiconductor layers 25, as set forth above. As shown in FIG. 19A, since the first insulating layers (inner spacers) 35 are formed, the etching of the first semiconductor layers 20 stops at the first insulating layer 35. In other words, the first insulating layer 35 functions as an etch-stop layer for etching of the first semiconductor layers 20. The channel formation operations for the n-type region are performed, while the p-type region is covered by a protective layer.

Figure 19B:
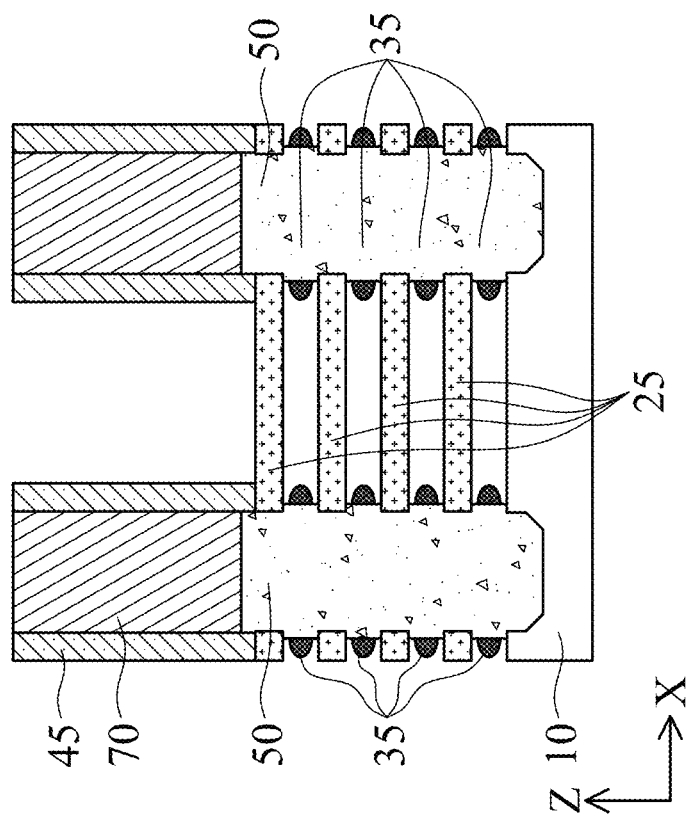

Similarly, the second semiconductor layers 25 are removed in the p-type region, thereby forming wires (channel regions) of the first semiconductor layers 20, as shown in FIG. 19B. The second semiconductor layers 25 can be removed or etched using an etchant that can selectively etch the second semiconductor layers 25 against the first semiconductor layers 20, as set forth above. As shown in FIG. 19B, since the second insulating layers (inner spacers) 65 are formed, the etching of the second semiconductor layers 25 stops at the second insulating layer 65. In other words, the second insulating layer 65 functions as an etch-stop layer for etching of the second semiconductor layers 25. The channel formation operations for the p-type region are performed, while the n-type region is covered by a protective layer. The formation of the channel regions for the p-type region can be performed after the formation of the channel regions for the n-type region.

Figure 20B:
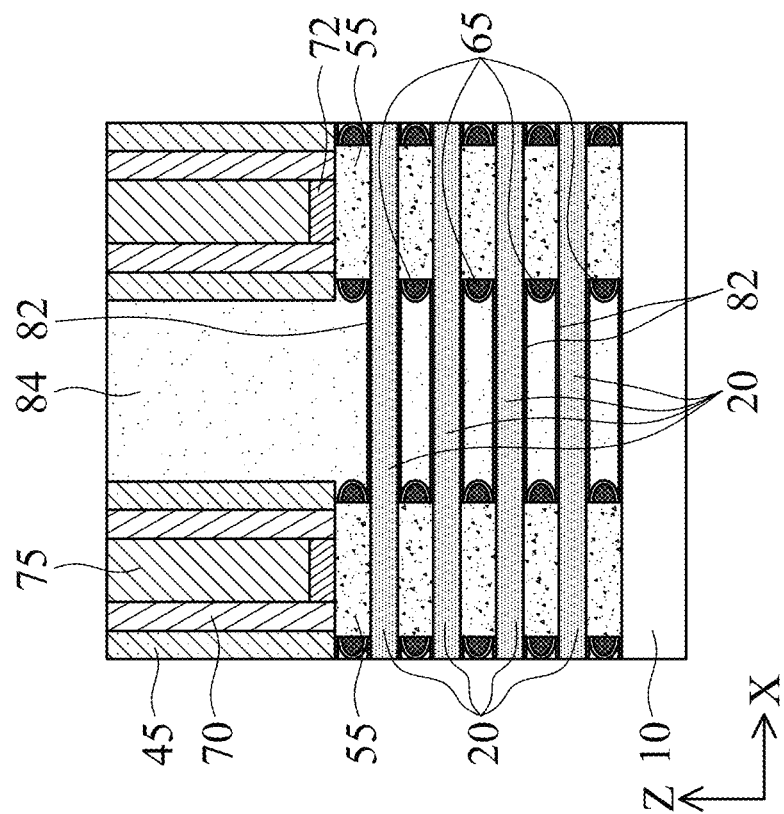
FIGS. 20A and 20B show one of the various stages of manufacturing a semiconductor GAA FET device according to an embodiment of the present disclosure.
Figure 20A:
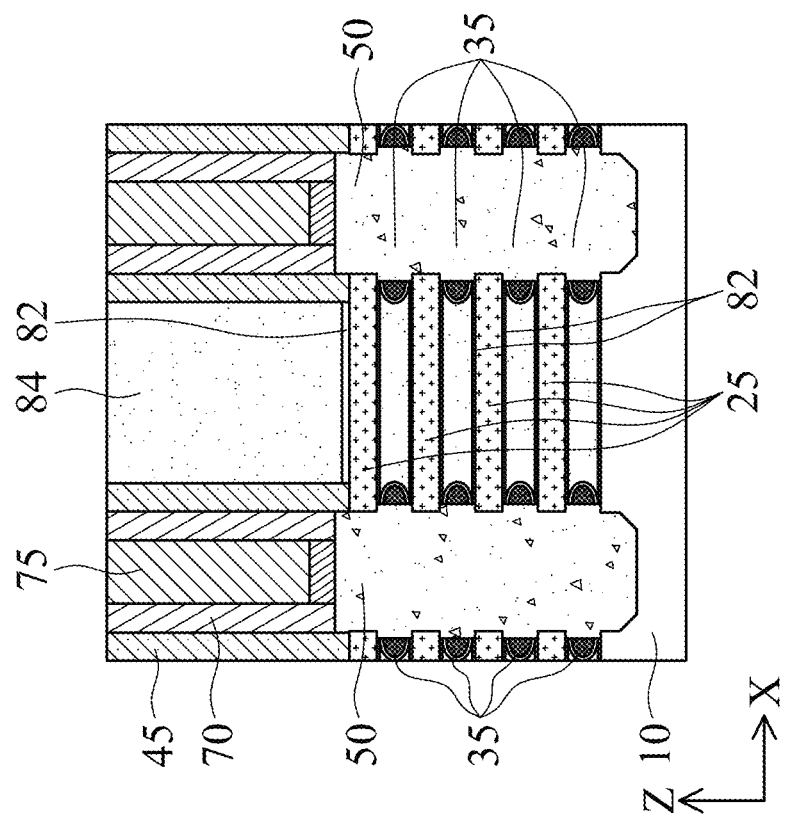

After the semiconductor wires (channel regions) of the second semiconductor layers 25 in the n-type region and the first semiconductor layers 20 in the p-type region are formed, a gate dielectric layer 82 is formed around each channel regions for the n-type region and the p-type region. Further, a gate electrode layer 84 is formed on the gate dielectric layer 82, as shown in FIGS. 20A and 20B. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode 84. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 70 by using dry etching, thereby exposing the upper portion of the source/drain epitaxial layer 50. In some embodiments, a silicide layer is formed over the source/drain epitaxial layer 50. The silicide layer includes one or more of WSi, CoSi, NiSi, TiSi, MoSi and TaSi. Then, a conductive contact layer 72 is formed in the contact holes as shown in FIGS. 1A-1D. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN.

It is noted that in the foregoing embodiments, the order of the processes for the n-type GAA FET and the processes for the p-type GAA FET can be interchangeable. For example, in the foregoing embodiments, the inner spacers 35 for the n-type GAA FET are first formed and then the inner spacers 65 for the p-type GAA FET are formed. In other embodiments, the inner spacers 65 for the p-type GAA FET are first formed and then the inner spacers 35 for the n-type GAA FET are formed.

As set forth above, one or more first semiconductor layers 20 in the p-type GAA FET has a modulated Ge concentration.

It is understood that the GAA FETs undergo further CMOS processes to form various features such as contacts/vias, interconnect metal layers, dielectric layers, passivation layers, etc.

In some embodiments, the inner spacers 35 for an n-type FET and the inner spacers 65 for a p-type FET are formed at the same time.

Figure 21:
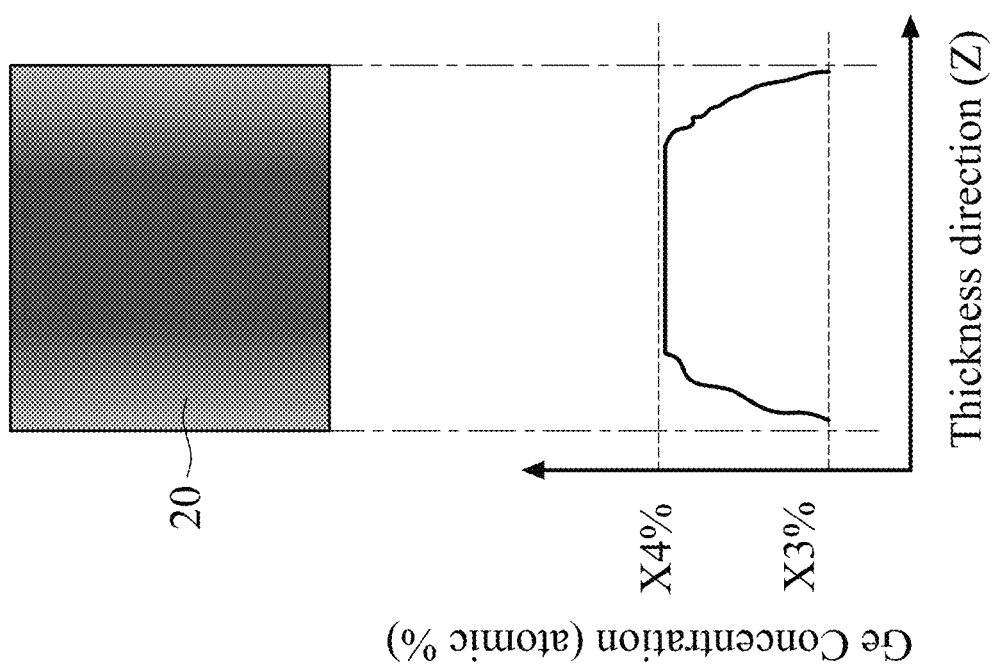
FIG. 21 shows a composition change (profile) of a first semiconductor layer according to another embodiment of the present disclosure.

FIG. 21 shows a composition change (profile) of a first semiconductor layer according to another embodiment of the present disclosure. In some embodiments, depending on an etchant used in laterally etching the first semiconductor layers 20 (see, FIG. 8A) and/or the material of the second semiconductor layers 25 (e.g., Group III-V semiconductor), the Ge concentration can be reversed as opposed to that shown in FIG. 5C or 5D. In some embodiments, as shown in FIG. 21, the Ge concentration has a substantially constant portion having a concentration X4% and the Ge concentration decreases to X3% at the edges (interface to the second semiconductor layer 25). In some embodiments, the Ge concentration linearly decreases, and in other embodiments, the Ge concentration decreases gradually (not linear). In some embodiments, X3 is in a range from about 15 to about 35 and is in a range from about 20 to about 30 in other embodiments. In some embodiments, X4 is in a range from about 25 to about 50 and is in a range from about 30 to about 40 in other embodiments. In some embodiments, the thickness of the constant portion is about 20% to about 60% of the total thickness of one first semiconductor layer.

The various embodiments or examples described herein offer several advantages over the existing art. For example, in the present disclosure, in a GAA FET, an inner spacer having a curved shape is provided between a metal gate electrode and a source/drain epitaxial layer. The curved shaped can be controlled by using a modulated Ge concentration in first semiconductor layers (sacrificial semiconductor layers). The methods disclosed herein more uniformly form the inner spacers by using wet etching. Further, due to a self-limited etch stop property of the inner spacers, it is possible to more precisely control gate formation processes. With the foregoing embodiments, it is possible to more precisely control the thickness, the shape and/or the location of the inner spacers and thus to control capacitances around the source/drain and the gate.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure, in which first semiconductor layers and second semiconductor layers are alternately stacked, is formed. A sacrificial gate structure is formed over the fin structure. A source/drain region of the fin structure, which is not covered by the sacrificial gate structure, is etched, thereby forming a source/drain space. The first semiconductor layers are laterally etched through the source/drain space. An inner spacer made of a dielectric material is formed on an end of each of the etched first semiconductor layers. A source/drain epitaxial layer is formed in the source/drain space to cover the inner spacer. At least one of the first semiconductor layers has a composition which changes along a stacked direction of the first semiconductor layers and second semiconductor layers. In one or more of the foregoing or following embodiments, a lateral end of the at least one of the first semiconductor layers has a curved shape. In one or more of the foregoing or following embodiments, the first semiconductor layers are laterally etched by wet etching. In one or more of the foregoing or following embodiments, the wet etching comprises repeating wet etchings using a mixed solution of $H_2O_2$, $CH_3COOH$ and HF, followed by $H_2O$ cleaning. In one or more of the foregoing or following embodiments, the inner spacer is formed by forming a dielectric layer in the source/drain space, and etching the dielectric layer, thereby leaving the inner spacer on the end of each of the etched first semiconductor layers remaining. In one or more of the foregoing or following embodiments, before the first semiconductors are laterally etched, sidewall spacers are formed on side faces of the sacrificial gate structure, and the sidewall spacers are made of a different material than the inner spacer. In one or more of the foregoing or following embodiments, the inner spacers include at least one of silicon nitride and silicon oxide. In one or more of the foregoing or following embodiments, the inner spacers include at least one of SiOC, SiOCN and SiCN. In one or more of the foregoing or following embodiments, in the etching a source/drain region of the fin structure, the first and second semiconductor layers of the source/drain region of the fin structure are etched. In one or more of the foregoing or following embodiments, in the etching a source/drain region of the fin structure, the first semiconductor layers of the source/drain region of the fin structure are selectively etched, thereby leaving the second semiconductor layers remaining. In one or more of the foregoing or following embodiments, after the source/drain epitaxial layer is formed, the sacrificial gate structure is removed, thereby exposing a part of the fin structure, the first semiconductor layers are removed rom the exposed fin structure, thereby forming channel layers including the second semiconductor layers, and a gate dielectric layer and a gate electrode layer are formed around the channel layers. The gate electrode layer is isolated from the source/drain epitaxial layer by the inner spacer and the gate dielectric layer. In one or more of the foregoing or following embodiments, the first semiconductor layers are made of SiGe, and the second semiconductor layers are made of Si. In one or more of the foregoing or following embodiments, in the at least one of the first semiconductor layers, a Ge concentration at a center region is smaller than a Ge concentration at edge regions along the stacked direction.

In accordance with another aspect of the present disclosure, in a method of manufacturing a semiconductor device, a first fin structure and a second fin structure, in both which first semiconductor layers and second semiconductor layers are alternately stacked, are formed. A first sacrificial gate structure is formed over the first fin structure and a second sacrificial gate structure over the second fin structure. While the second fin structure with the second sacrificial gate structure are protected, a source/drain region of the first fin structure, which is not covered by the first sacrificial gate structure, is etched thereby forming a first source/drain space, the first semiconductor layers are etched in the first source/drain space, a first inner spacer made of a dielectric material is formed on an end of each of the etched first semiconductor layers, and a first source/drain epitaxial layer is formed in the first source/drain space to cover the inner spacer, thereby forming a first structure. While the first structure is protected, the second semiconductor layers are etched in a source/drain region of the second fin structure, which is not covered by the second sacrificial gate structure, thereby forming a second source/drain space, the second semiconductor layers are laterally etched through the second source/drain space, a second inner spacer made of a dielectric material is formed on an end of each of the etched second semiconductor layers, and a second source/drain epitaxial layer is formed in the second source/drain space to cover the second inner spacer, thereby forming a second structure. At least one of the first semiconductor layers has a composition which changes along a stacked direction of the first semiconductor layers and second semiconductor layers. In one or more of the foregoing or following embodiments, in the etching the second semiconductor layers in a source/drain region of the second fin structure, the second semiconductor layers are selectively etched, thereby leaving the first semiconductor layers remaining, and the second source/drain epitaxial layer wraps around the first semiconductor layers. In one or more of the foregoing or following embodiments, the first semiconductor layers are made of SiGe, the second semiconductor layers are made of Si, and in the at least one of the first semiconductor layers, a Ge concentration at a center region is smaller than a Ge concentration at edge regions along the stacked direction. In one or more of the foregoing or following embodiments, the Ge concentration at the center region is in a range from 15% to 35%, and the Ge concentration at the edge regions is in a range from 25% to 50%. In one or more of the foregoing or following embodiments, the first semiconductor layers are made of SiGe, the second semiconductor layers are made of Si, and in the at least one of the first semiconductor layers, a Ge concentration has two peaks and a reference Ge concentration region between the two peaks. In one or more of the foregoing or following embodiments, the Ge concentration $G_p$ at the two peaks and the concentration $G_r$ at the reference Ge concentration region satisfy $1.3 \times G_r \leq G_p \leq 1.7 \times G_r$.

In accordance with one aspect of the present disclosure, a semiconductor device includes semiconductor wires or sheets disposed over a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around the each channel region, and insulating spacers disposed in spaces, respectively, the spaces being defined by adjacent semiconductor wires or sheets, the gate electrode layer and the source/drain region. The channel region is made of SiGe and a Ge concentration changes along a vertical direction. In one or more of the foregoing or following embodiments, the insulating spacers are in contact with the source/drain epitaxial layer. In one or more of the foregoing or following embodiments, the semiconductor device further includes sidewall spacers disposed on side faces of the gate electrode layer. The sidewall spacers are made of a different material than the insulating spacers. In one or more of the foregoing or following embodiments, the insulating spacers include at least one of silicon nitride and silicon oxide. In one or more of the foregoing or following embodiments, the insulating spacers include at least one of SiOC, SiOCN and SiCN. In one or more of the foregoing or following embodiments, the source/drain epitaxial layer is in contact with lateral end faces of the semiconductor wires. In one or more of the foregoing or following embodiments, the semiconductor wires or sheets are made of SiGe. In one or more of the foregoing or following embodiments, the source/drain epitaxial layer wraps around end portions of the semiconductor wires.

In accordance with another aspect of the present disclosure, a semiconductor device includes semiconductor wires or sheets disposed over a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around the each channel region, and insulating spacers disposed in spaces, respectively. The spaces are defined by adjacent semiconductor wires, the gate electrode layer and the source/drain region. In one or more of the foregoing or following embodiments, each of the insulating spacers has a curved end, and at least one of the insulating spacers is disposed above an uppermost one of the semiconductor wires or sheets. In one or more of the foregoing or following embodiments, the semiconductor wires or sheets are made of SiGe and a Ge concentration changes along a vertical direction. In one or more of the foregoing or following embodiments, the semiconductor device further includes sidewall spacers disposed on side faces of the gate electrode layer. The sidewall spacers are made of a different material than the insulating spacers. In one or more of the foregoing or following embodiments, the insulating spacers include at least one of silicon nitride and silicon oxide. In one or more of the foregoing or following embodiments, the insulating spacers include at least one of SiOC, SiOCN and SiCN. In one or more of the foregoing or following embodiments, the source/drain epitaxial layer is in contact with lateral end faces of the semiconductor wires.

In accordance with another aspect of the present disclosure, a semiconductor device includes semiconductor wires or sheets disposed over a substrate, a source/drain epitaxial layer in contact with the semiconductor wires, a gate dielectric layer disposed on and wrapping around each channel region of the semiconductor wires, a gate electrode layer disposed on the gate dielectric layer and wrapping around the each channel region, and insulating spacers disposed in spaces, respectively, the spaces being defined by adjacent semiconductor wires, the gate electrode layer and the source/drain region. Each of the insulating spacers has a curved end cross section, and the source/drain epitaxial layer wraps around end portions of the semiconductor wires. In one or more of the foregoing or following embodiments, the semiconductor wires or sheets are made of SiGe and a Ge concentration changes along a vertical direction. In one or more of the foregoing or following embodiments, the insulating spacers are in contact with the source/drain epitaxial layer. In one or more of the foregoing or following embodiments, the insulating spacers include at least one of SiOC, SiOCN and SiCN.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a fin structure in which first semiconductor layers and second semiconductor layers are alternately stacked;
   forming a sacrificial gate structure over the fin structure;
   etching a source/drain region of the fin structure, which is not covered by the sacrificial gate structure, thereby forming a source/drain space;
   laterally etching the second semiconductor layers through the source/drain space;
   forming an inner spacer made of a dielectric material on an end of each of the etched second semiconductor layers; and
   forming a source/drain epitaxial layer in the source/drain space to cover the inner spacer,
   wherein at least one of the first semiconductor layers has a composition which changes along a stacked direction of the first semiconductor layers and second semiconductor layers.

2. The method of claim 1, wherein a lateral end of the etched second semiconductor layers has a curved shape.

3. The method of claim 1, wherein the second semiconductor layers are laterally etched by wet etching.

4. The method of claim 3, wherein the wet etching comprises repeating wet etchings using an ammonium hydroxide (NH$_4$OH) solution or a tetramethylammonium hydroxide (TMAH) solution.

5. The method of claim 1, wherein the inner spacer is formed by:
   forming a dielectric layer in the source/drain space; and
   etching the dielectric layer, thereby leaving the inner spacer on the end of each of the etched second semiconductor layers remaining.

6. The method of claim 1, further comprising, before the second semiconductors are laterally etched, forming sidewall spacers on side faces of the sacrificial gate structure,
   wherein the sidewall spacers are made of a different material than the inner spacer.

7. The method of claim 6, wherein the inner spacers include at least one of silicon nitride and silicon oxide.

8. The method of claim 6, wherein the inner spacers include at least one of SiOC, SiOCN and SiCN.

9. The method of claim 1, wherein in the etching a source/drain region of the fin structure, the first and second semiconductor layers of the source/drain region of the fin structure are etched.

10. The method of claim 1, wherein in the etching a source/drain region of the fin structure, the second semiconductor layers of the source/drain region of the fin structure are selectively etched, thereby leaving the first semiconductor layers remaining.

11. The method of claim 1, further comprising, after the source/drain epitaxial layer is formed:
    removing the sacrificial gate structure, thereby exposing a part of the fin structure;
    removing the second semiconductor layers from the exposed fin structure, thereby forming channel layers including the first semiconductor layers; and
    forming a gate dielectric layer and a gate electrode layer around the channel layers,
    wherein the gate electrode layer is isolated from the source/drain epitaxial layer by the inner spacer and the gate dielectric layer.

12. The method of claim 1, wherein:
    the first semiconductor layers are made of SiGe, and
    the second semiconductor layers are made of Si.

13. The method of claim 12, wherein in the at least one of the first semiconductor layers, a Ge concentration at a center region is smaller than a Ge concentration at edge regions along the stacked direction.

14. A method of manufacturing a semiconductor device, comprising:
    forming a first fin structure and a second fin structure, wherein first semiconductor layers and second semiconductor layers are alternately stacked in each of the first fin structure and the second fin structure;
    forming a first sacrificial gate structure over the first fin structure and a second sacrificial gate structure over the second fin structure;
    while the second fin structure with the second sacrificial gate structure is protected,
      etching a source/drain region of the first fin structure, which is not covered by the first sacrificial gate structure, thereby forming a first source/drain space;
      laterally etching the first semiconductor layers in the first source/drain space;
      forming a first inner spacer made of a dielectric material on an end of each of the etched first semiconductor layers; and
      forming a first source/drain epitaxial layer in the first source/drain space to cover the inner spacer, thereby forming a first structure;
    while the first structure is protected,
      etching the second semiconductor layers in a source/drain region of the second fin structure, which is not covered by the second sacrificial gate structure, thereby forming a second source/drain space;
      laterally etching the second semiconductor layers through the second source/drain space;
      forming a second inner spacer made of a dielectric material on an end of each of the etched second semiconductor layers; and
      forming a second source/drain epitaxial layer in the second source/drain space to cover the second inner spacer, thereby forming a second structure, wherein:
    the first semiconductor layers include Ge, and
    in at least one of the first semiconductor layers, a Ge concentration at a center region is smaller than a Ge concentration at edge regions along the stacked direction.

15. The method of claim 14, wherein:
    the first semiconductor layers are made of SiGe, and
    the second semiconductor layers are made of Si.

16. The method of claim 15, wherein the Ge concentration at the center region is in a range from 15% to 35%, and the Ge concentration at the edge regions is in a range from 25% to 50%.

17. The method of claim 14, wherein:
the first semiconductor layers are made of SiGe,
the second semiconductor layers are made of Si, and
in the at least one of the first semiconductor layers, a Ge concentration has two peaks and a reference Ge concentration region between the two peaks.

18. The method of claim 17, wherein:
the Ge concentration Gp at the two peaks and the concentration Gr at the reference Ge concentration region satisfy $1.3 \times Gr \leq Gp \leq 1.7 \times Gr$.

19. A method of manufacturing a semiconductor device, comprising:
forming a fin structure in which first semiconductor layers and second semiconductor layers are alternately stacked;
forming a sacrificial gate structure over the fin structure;
etching a source/drain region of the fin structure, which is not covered by the sacrificial gate structure, thereby forming a source/drain space;
laterally etching the second semiconductor layers through the source/drain space;
forming an inner spacer made of a dielectric material on an end of each of the etched second semiconductor layers; and
forming a source/drain epitaxial layer in the source/drain space to cover the inner spacer, wherein:
the first semiconductor layers include Ge, and
in the at least one of the first semiconductor layers, a Ge concentration at a center region is smaller than a Ge concentration at edge regions along the stacked direction.

20. The method of claim 19, wherein the Ge concentration at the center region is in a range from 15% to 35%, and the Ge concentration at the edge regions is in a range from 25% to 50%.

* * * * *